United States Patent [19]
Muraki et al.

[11] Patent Number: 5,929,454
[45] Date of Patent: Jul. 27, 1999

[54] POSITION DETECTION APPARATUS, ELECTRON BEAM EXPOSURE APPARATUS, AND METHODS ASSOCIATED WITH THEM

[75] Inventors: Masato Muraki, Inagi; Susumu Goto, Tama, both of Japan

[73] Assignee: Canon Kabushiki Kaisha, Tokyo, Japan

[21] Appl. No.: 08/873,337

[22] Filed: Jun. 11, 1997

[30] Foreign Application Priority Data

Jun. 12, 1996 [JP] Japan ..................................... 8-150983
Jun. 12, 1996 [JP] Japan ..................................... 8-150989

[51] Int. Cl.⁶ ......................... H01L 21/027; H01J 37/304
[52] U.S. Cl. .......................................................... 250/491.1
[58] Field of Search ........................................... 250/491.1

[56] References Cited

U.S. PATENT DOCUMENTS

| | | | |
|---|---|---|---|
| 4,130,761 | 12/1978 | Matsuda | 250/492 |
| 4,132,898 | 1/1979 | Buelow et al. | 250/492 A |
| 4,370,554 | 1/1983 | Bohlen et al. | 250/491.1 |
| 4,724,328 | 2/1988 | Lischke | 250/492.2 |
| 4,812,662 | 3/1989 | Goto et al. | 250/491.1 |
| 4,980,567 | 12/1990 | Yasuda et al. | 250/398 |
| 5,260,579 | 11/1993 | Yasuda et al. | 250/492.2 |
| 5,422,491 | 6/1995 | Sakamoto | 250/492.22 |

Primary Examiner—Jack I. Berman
Attorney, Agent, or Firm—Fitzpatrick, Cella, Harper & Scinto

[57] ABSTRACT

The position of an alignment mark is accurately detected independently of distortion of the sectional structure of the alignment mark or the coating state of a resist that covers the alignment mark. This invention provides a position detection apparatus for detecting the position of an alignment mark formed on an object using an electron beam, which has an element electron optical system array (3) for irradiating electron beams onto the object in a matrix, and a deflector (6) for deflecting the plurality of electron beams. The deflector (6) scans the plurality of electron beams on the alignment mark, a reflected electron detector (9) synthesizes and detects reflected electrons or secondary electrons from the alignment mark upon scanning, and the position of the alignment mark is determined on the basis of the displacement amount of the electron beams and the detection result.

36 Claims, 22 Drawing Sheets

INTERMEDIATE IMAGE

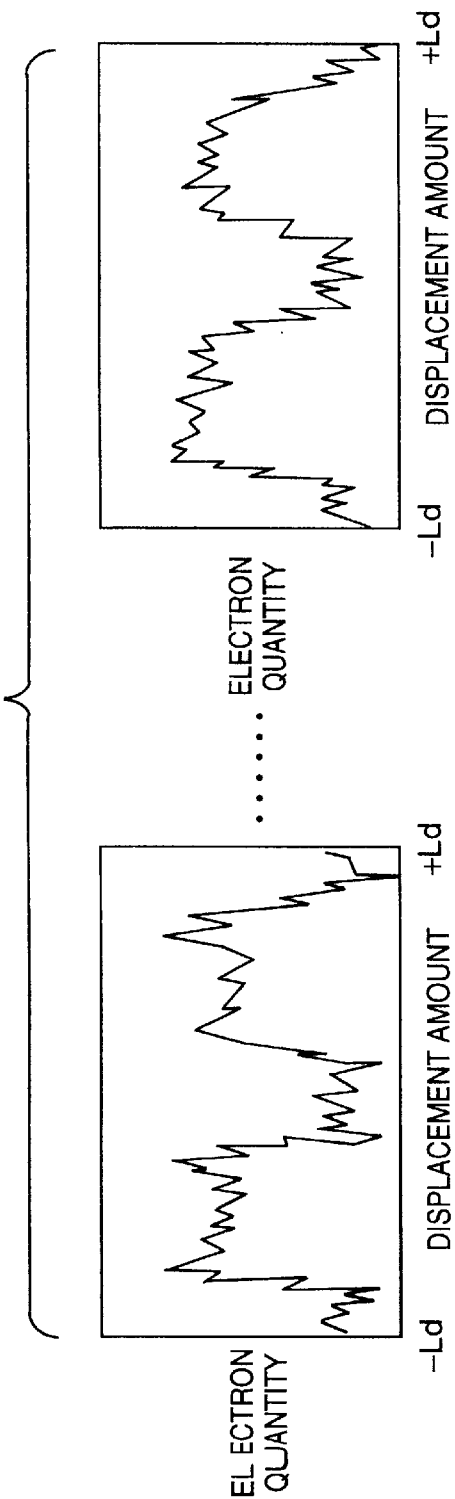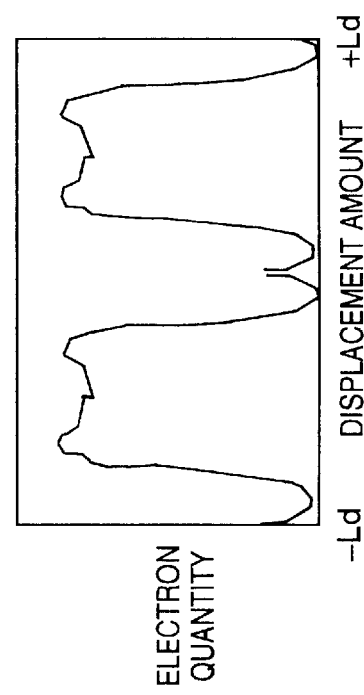

F I G. 14A
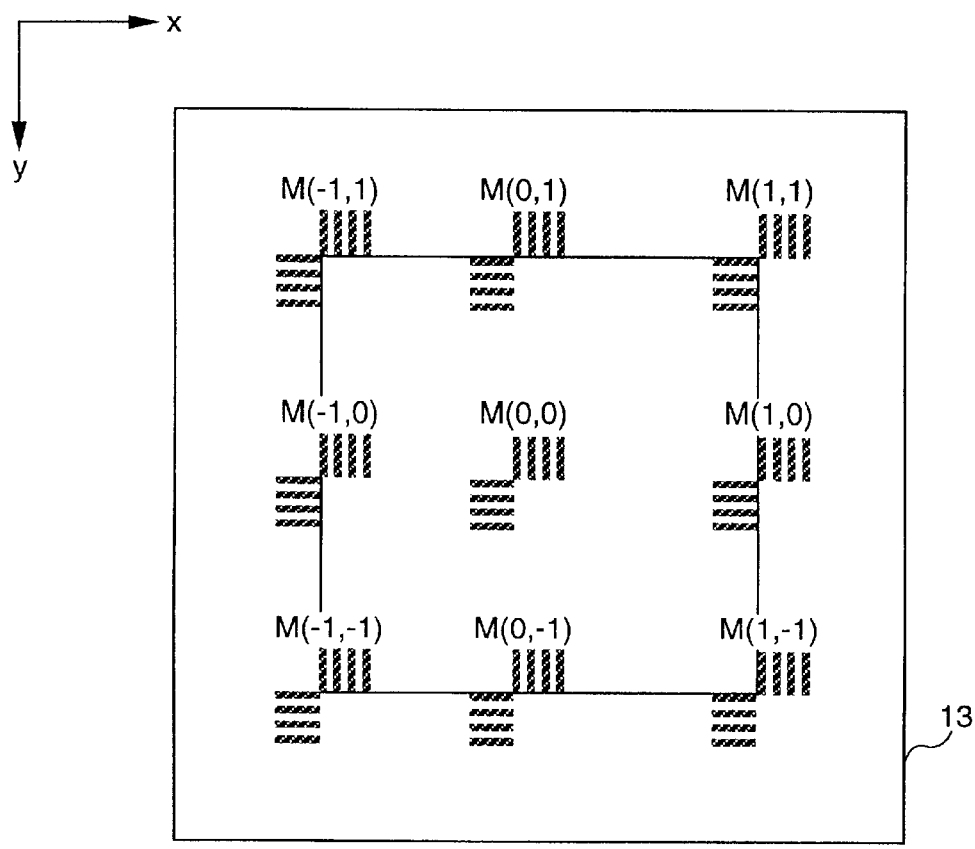
F I G. 14B
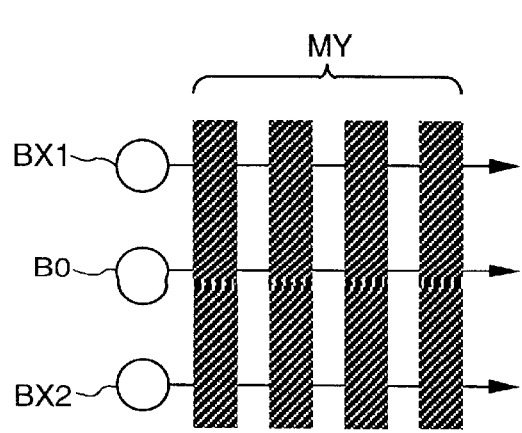
F I G. 14C
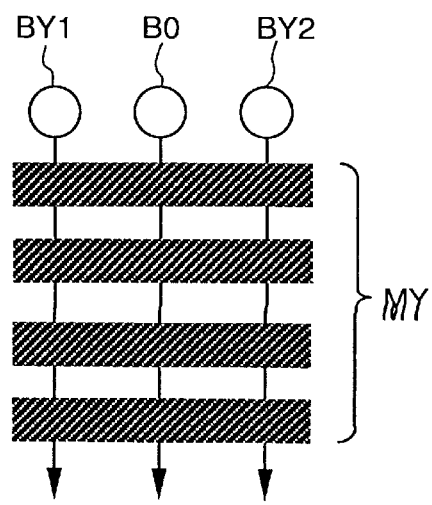

FLOW IN MANUFACTURE OF SEMICONDUCTOR DEVICE

POSITION DETECTION APPARATUS, ELECTRON BEAM EXPOSURE APPARATUS, AND METHODS ASSOCIATED WITH THEM

BACKGROUND OF THE INVENTION

The present invention relates to a position detection apparatus and method, and an electron beam exposure apparatus and a correction method of the imaging state of an electron beam in the apparatus and, more particularly, to a position detection apparatus and method for irradiating an electron beam onto a mark to detect the position of the mark, and an electron beam exposure apparatus having a function of irradiating an electron beam onto a mark and correcting the imaging state of the electron beam on the basis of reflected electrons or secondary electrons, and its adjustment method.

An electron beam exposure apparatus must draw a new pattern on a wafer while aligning it with the position of the pattern already formed on the wafer. For this purpose, an alignment mark pre-formed on the wafer is detected, and the new pattern is drawn with reference to the detected position.

The electron beam exposure apparatus draws a pattern by deflecting an electron beam. However, when the electron beam is deflected, the imaging state of the electron beam deteriorates due to deflection errors. For this reason, the imaging state must be corrected in correspondence with the position at which the electron beam is to be imaged upon deflection.

FIG. 20 shows the arrangement of a point beam type electron beam exposure apparatus using a beam in the form of a spot. Reference numeral 201 denotes an electron gun for radiating an electron beam. The electron gun 201 ON/OFF-controls electron beam radiation in correspondence with the pattern to be drawn. Reference numeral 202 denotes a reduction electron optical system for shaping the electron beam from the electron gun 201 into a point shape, and for projecting it onto a wafer 203 in a reduced scale; 204, a deflector for scanning the wafer by the point-shaped electron beam; 205, an X-Y stage which moves while carrying the wafer; and 206, a detector for detecting reflected electrons or secondary electrons upon scanning an alignment mark on the wafer by the electron beam.

The alignment method in the above-mentioned arrangement will be explained below. When a new pattern is to be drawn on a pattern already formed on a wafer, a linear alignment mark formed on the wafer is located by the X-Y stage 205 in the vicinity of the irradiation reference position of the point-shaped electron beam. The electron beam is scanned by the deflector 204 on the alignment mark, and reflected electrons or secondary electrons from the alignment mark are detected by the detector. The position of the alignment mark with respect to the irradiation reference position of the point-shaped electron beam is obtained on the basis of the relationship between the scanning position and the quantity of reflected electrons or secondary electrons detected upon scanning. Thereafter, the electron beam is scanned with reference to the obtained alignment mark position, and the electron beam is ON/OFF-controlled in correspondence with the pattern to be drawn, thereby drawing a new pattern on the wafer.

FIG. 21A is a plan view of an alignment mark AM formed on the wafer, FIGS. 21B and 21C are sectional views of alignment marks AM formed at different positions on the wafer, and FIGS. 21D and 21E show alignment signals which represent the quantities of reflected electrons or secondary electrons detected upon scanning the alignment marks AM shown in FIGS. 21B and 21C. Note that the arrows in FIGS. 21A to 21C show the scanning direction of the electron beam.

As shown in FIGS. 21B and 21C, the sectional structures of the alignment marks AM differ depending on their positions on the wafer, formation method, and the like. Also, the coating states of a resist that covers the alignment marks AM differ depending on the positions of the alignment marks AM on the wafer and their sectional structures, the structures of patterns near the alignment marks AM, and the like. Accordingly, alignment signals that detect the alignment marks differ in units of alignment marks AM to be detected. Also, random noise from a disturbance and the detection system itself is superposed on the alignment signals. For this reason, errors are produced in the detected positions of the alignment marks.

The method of correcting the imaging state of the electron beam in the above-mentioned arrangement will be explained below. FIG. 22A is a plan view of a linear reference mark SM, FIG. 22B is a sectional view of the reference mark SM, and FIG. 22C shows a mark signal as the quantity of reflected electrons or secondary electrons detected upon scanning the reference mark SM. Note that the arrows in FIGS. 22A and 22B indicate the scanning direction of the electron beam.

In order to correct the imaging state of the electron beam, as shown in FIGS. 22A and 22B, the reference mark SM is scanned by the electron beam, and reflected electrons or secondary electrons from the reference mark SM upon scanning are detected by the detector 206. FIG. 22C shows the mark signal as the output from the detector 206. Imaging state correction data for correcting the imaging state is obtained based on this mark signal, and the characteristics of the reduction electron optical system 202 are corrected on the basis of the imaging state correction data in correspondence with the position at which the electron beam is to be imaged upon deflection.

However, signal components of the mark signal are small and, hence, the ratio of noise is large (poor S/N ratio), as shown in FIG. 22C. When the electron beam is focused to draw a micropattern, the signal components of the mark signal become smaller, and the influence of noise becomes larger. Accordingly, a demand has arisen for a method that can appropriately adjust the imaging state by improving the S/N ratio of such a mark signal.

SUMMARY OF THE INVENTION

It is the first object of the present invention to improve the detection precision of the mark position.

According to the present invention, the foregoing object is attained by providing a position detection apparatus for detecting a position of a mark formed on an object using an electron beam, the apparatus comprising irradiation means for irradiating a plurality of electron beams at different positions on the object, displacement means for displacing irradiated positions of the electron beams on the object by a substantially equal displacement amount in a predetermined direction, electron detection means for synthesizing and detecting reflected electrons or secondary electrons from the mark produced by the electron beams while displacing the irradiated positions of the plurality of electron beams on the mark of the object by the displacement means, and determination means for determining the position of the mark on the basis of a relationship between the displacement amount of the irradiated positions and a detection result from the electron detection means.

In a preferred embodiment, the irradiation means irradiates the plurality of electron beams with the irradiated positions of the plurality of electron beams on the object being arranged in a direction perpendicular to the predetermined direction.

In a preferred embodiment, parallel linear patterns are arranged in the mark.

In a preferred embodiment, the irradiation means irradiates the plurality of electron beams with the irradiated positions of the plurality of electron beams on the object forming a matrix, and a pitch of the linear patterns of the mark is determined on the basis of an interval between the plurality of electron beams on the object in the predetermined direction.

In a preferred embodiment, when Pm represents the pitch of the linear patterns of the mark, and Pb represents the interval between the plurality of electron beams on the object in the predetermined direction, the pitch Pm and the interval Pb satisfy:

Pb=N×Pm (N is an integer).

In a preferred embodiment, the determination means comprises means for detecting a phase of a periodic signal of a frequency determined by a pitch of the linear pattern of the mark on the basis of a relationship between the displacement amount of the irradiated positions and a detection signal from the electron detection means, and determines the position of the mark on the basis of the detected phase.

In a preferred embodiment, the displacement means displaces the irradiated positions of the electron beams on the object by deflecting the plurality of electron beams irradiated from the irradiation means.

In a preferred embodiment, the displacement means displaces the irradiated positions of the electron beams on the object by displacing the position of the object.

According to another aspect of the present invention, the foregoing object is attained by providing an electron beam exposure apparatus which comprises irradiation means for irradiating a plurality of electron beams onto an object to be arranged at a predetermined interval, and deflection means for displacing the electron beams by a substantially equal displacement amount on the object, and exposes the object to the plurality of electron beams, the apparatus comprising moving means, carrying the object, for causing a mark formed on the object to fall within an irradiation region of the plurality of electron beams, displacement control means for controlling the deflection means and/or the moving means so as to displace irradiated positions of the electron beams on the object by a substantially equal displacement amount in a predetermined direction, electron detection means for synthesizing and detecting reflected electrons or secondary electrons from the mark produced by the electron beams while changing the irradiated positions of the plurality of electron beams on the mark formed on the object by the displacement control means, and determination means for determining a position of the mark on the basis of the displacement amount of the irradiated positions and a detection result from the electron detection means.

In still another aspect of the present invention, the foregoing object is attained by providing a position detection method for detecting a position of a mark formed on an object using an electron beam comprising the electron detection step of irradiating a plurality of electron beams at different positions on the object, and synthesizing and detecting reflected electrons or secondary electrons from the mark produced by the electron beams while displacing irradiated positions of the electron beams on the mark formed on the object by a substantially equal displacement amount in a predetermined direction, and the determination step of determining a position of the mark on the basis of the relationship between the displacement amount of the irradiated positions, and a detection result of the reflected electrons or secondary electrons in the electron detection step.

It is the second object of the present invention to improve the correction precision of the imaging state of an electron beam.

According to the present invention, the foregoing object is attained by providing an electron beam exposure apparatus which comprises emission means for emitting an electron beam, a reduction electron optical system for projecting the electron beam emitted by the emission means onto a substrate in a reduced scale, deflection means for deflecting the electron beam to be irradiated onto the substrate, and a stage which carries the substrate, the apparatus comprising a reference plate arranged on the stage, the reference plate having a mark in which parallel linear patterns are arranged, setting means for setting an imaging state of the electron beam to be irradiated onto the substrate, displacement control means for controlling the deflection means and/or the stage so as to displace an irradiated position of the electron beam on the reference plate on the stage in the arranging direction of the linear patterns, electron detection means for detecting reflected electrons or secondary electrons from the mark produced by the irradiated electron beam while changing the irradiated position of the electron beam on the mark of the reference plate by the displacement control means, and adjustment means for detecting a strength of a periodic signal of a frequency determined by a pitch of the linear patterns of the mark on the basis of a relationship between a displacement amount of the irradiated position and a detection signal from the electron detection means, confirming the imaging state of the electron beam on the basis of the strength, and adjusting the setting means on the basis of the confirmed imaging state.

In a preferred embodiment, the adjustment means sequentially changes a setting value to be set in the setting means, confirms the imaging state of the electron beam on the reference plate at each of the setting values so as to obtain data indicating a relationship between the setting values and imaging states, and adjusts the setting means on the basis of the data.

In a preferred embodiment, the emission means emits a plurality of electron beams which are arranged in a direction perpendicular to the arranging direction of the parallel linear patterns on the reference plate, and the electron detection means synthesizes and detects the reflected electrons or secondary electrons from the mark produced by the irradiated electron beams.

In a preferred embodiment, the emission means emits a plurality of electron beams which form a matrix on the reference plate, and the electron detection means synthesizes and detects the reflected electrons or secondary electrons from the mark produced by the irradiated electron beams.

In a preferred embodiment, the reference plate has a first mark in which parallel linear patterns are arranged in a first direction, and a second mark in which parallel linear patterns are arranged in a second direction perpendicular to the first direction, and the adjustment means confirms an imaging state of the electron beam on the first mark and an imaging state of the electron beam on the second mark beam, and adjusts the setting means on the basis of the confirmation result.

In a preferred embodiment, the adjustment means adjusts the setting means to optimize the imaging state of the electron beam upon drawing a pattern on the substrate on the basis of the confirmation result of the imaging state of the electron beam on the mark.

In a preferred embodiment, the setting means comprises focal point position correction means for correcting a focal point position of the electron beam to be irradiated onto the substrate, and the adjustment means adjusts the focal point position correction means to correct the focal point position of the electron beam upon drawing a pattern on the substrate on the basis of the confirmation result of the imaging state of the electron beam on the mark.

In a preferred embodiment, the setting means comprises astigmatism correction means for correcting astigmatism of the electron beam to be irradiated onto the substrate, and the adjustment means adjusts the astigmatism correction means to correct the astigmatism of the electron beam upon drawing a pattern on the substrate on the basis of the confirmation result of the imaging state of the electron beam on the mark.

In a preferred embodiment, the setting means comprises focal point position correction means for correcting a focal point position of the electron beam to be irradiated onto the substrate, and astigmatism correction means for correcting astigmatism of the electron beam to be irradiated onto the substrate, and the adjustment means adjusts the focal point position correction means and the astigmatism correction means to correct the focal point position and astigmatism of the electron beam upon drawing a pattern on the substrate on the basis of the confirmation result of the imaging state of the electron beam on the mark.

In another aspect of the present invention, the foregoing object is attained by providing a method of correcting an imaging state of an electron beam in an electron beam exposure apparatus which comprises emission means for emitting an electron beam, a reduction electron optical system for projecting the electron beam emitted by the emission means onto a substrate in a reduced scale, deflection means for deflecting the electron beam to be irradiated onto the substrate, a stage which carries the substrate and on which a reference plate having a mark in which parallel linear patterns are arranged is arranged, and setting means for setting an imaging state of the electron beam to be irradiated onto the substrate, the method comprising, the electron detection step of detecting reflected electrons or secondary electrons from the mark produced by the irradiated electron beam while displacing the irradiated position of the electron beam on the mark of the reference plate in the arranging direction of the linear patterns, and the adjustment step of detecting a strength of a periodic signal of a frequency determined by a pitch of the linear patterns of the mark on the basis of a relationship between a displacement amount of the irradiated position and a detection signal in the electron detection step, confirming the imaging state of the electron beam on the basis of the strength, and adjusting the setting means on the basis of the confirmed imaging state.

Further objects, features and advantages of the present invention will become apparent from the following detailed description of embodiments of the present invention with reference to the accompanying drawings.

BRIEF DESCRIPTION OF THE DRAWINGS

FIG. 8A shows alignment signals detected by a reflected electron detector upon individually scanning electron beams;

FIG. 8B shows an alignment signal obtained by synthesizing the alignment signals shown in FIG. 8A;

FIGS. 14A to 14C show stage reference marks;

DETAILED DESCRIPTION OF THE PREFERRED EMBODIMENTS

First Embodiment

[Constituting Elements of Electron Beam Exposure Apparatus]

Figure 1:
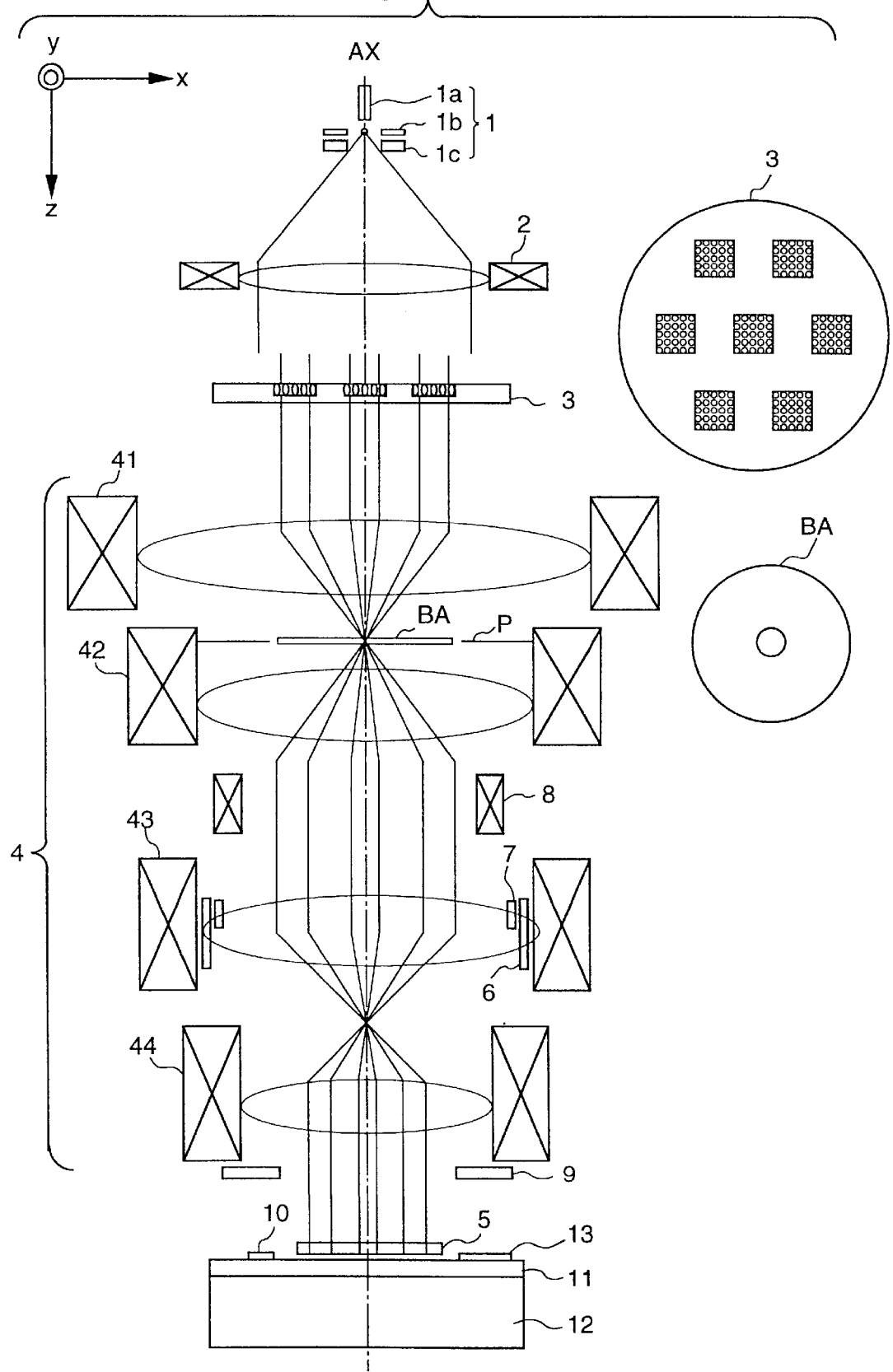
FIG. 1 is a schematic view showing the arrangement of an electron beam scanning apparatus according to the present invention.

FIG. 1 is a schematic view showing a principal part of an electron beam exposure apparatus according to the present invention.

Referring to FIG. 1, reference numeral 1 denotes an electron gun constituted by a cathode 1a, a grid 1b, and an anode 1c. Electrons emitted by the cathode 1a form a crossover image between the grid 1b and the anode 1c. These crossover images will be referred to as a "source" hereinafter.

Electrons coming from the source are converted into nearly collimated electron beams by a condenser lens 2, the front-side focal point position of which is located at the source position. The nearly parallel electron beams enter an element electron optical system array 3. The element electron optical system array 3 is formed by arranging a plurality of element electron optical systems each made up of a blanking electrode, an aperture, and an electron lens, in a direction perpendicular to an optical axis AX. The element electron optical system array 3 will be described in detail later.

The element electron optical system array 3 forms a plurality of intermediate images of the source. The individual intermediate images are projected in a reduced scale by a reduction electron optical system 4, thus forming source images on a wafer 5.

In this case, the elements of the element electron optical system array 3 are set so that the interval between adjacent source images on the wafer 5 equals an integer multiple of the size of each source image. Furthermore, the element electron optical system array 3 varies the positions, in the optical axis direction, of the intermediate images in correspondence with a curvature of field of the reduction electron optical system 4, and corrects in advance aberrations produced upon projecting the intermediate images onto the wafer 5 in the reduced scale by the reduction electron optical system 4.

The reduction electron optical system 4 comprises a symmetric magnetic doublet made up of a first projection lens 41 (43) and second projection lens 42 (44). If f1 represents the focal length of the first projection lens 41 (43) and f2 represents the focal length of the second projection lens 42 (44), the distance between these two lenses is f1+f2. The object point on the optical axis AX matches the focal point position of the first projection lens 41 (43), and its image point is formed at the focal point of the second projection lens 42 (44). This image is reduced to −f2/f1. Since two lens magnetic fields are set to act in opposite directions, Seidel's aberrations except for Seidel's five aberrations, i.e., spherical aberration, isotropic astigmatism, isotropic coma, curvature of field, and on-axis chromatic aberration, and chromatic aberrations associated with rotation and magnification are canceled.

Reference numeral 6 denotes a deflector for deflecting a plurality of electron beams from the element electron optical system array 3 to displace the plurality of source images on the wafer 5 by nearly equal displacement amounts in the X- and Y-directions. Although not shown, the deflector 6 is made up of a main deflector used when the deflection width is large, and a sub deflector used when the deflection width is small. The main deflector comprises an electromagnetic deflector, and the sub deflector comprises an electrostatic deflector.

Reference numeral 7 denotes a dynamic focusing coil for correcting errors of the focusing positions of the source images caused by deflection errors produced upon activating the deflector 6; and 8, a dynamic stigmatic coil for correcting astigmatism of deflection errors produced upon deflection as in the dynamic focusing coil 7.

Reference numeral 9 denotes a reflected electron detector for detecting reflected electrons or secondary electrons produced when the electron beams from the element electron optical system array 3 are irradiated onto alignment marks formed on the wafer 5 or marks on a stage reference plate 13.

Reference numeral 10 denotes a Faraday cup having two single knife edges extending in the X- and Y-directions. The Faraday cup 10 detects the charge amount of the source image formed by the electron beam from each element electron optical system.

Reference numeral 11 denotes a θ-Z stage which carries the wafer, and is movable in the direction of the optical axis AX (Z-axis) and in the rotational direction about the Z-axis. The above-mentioned stage reference plate 13 and the Faraday cup 10 are fixed on the θ-Z stage 11.

Reference numeral 12 denotes an X-Y stage which carries the θ-Z stage, and is movable in the X- and Y-directions perpendicular to the optical axis AX (Z-axis).

The element electron optical system array 3 will be explained below with reference to FIG. 2.

The element electron optical system array 3 includes a group (subarray) of a plurality of element electron optical systems, and a plurality of subarrays are formed. In this embodiment, seven subarrays A to G are formed. In each subarray, a plurality of element electron optical systems are two-dimensionally arranged. In each subarray of this embodiment, 25 element electron optical systems like D(1.1) to D(5,5) are formed, and form source images which are arranged at intervals of a pitch pb ($\mu$m) on the wafer in both the X- and Y-directions via the reduction electron optical system 4.

Figure 3:
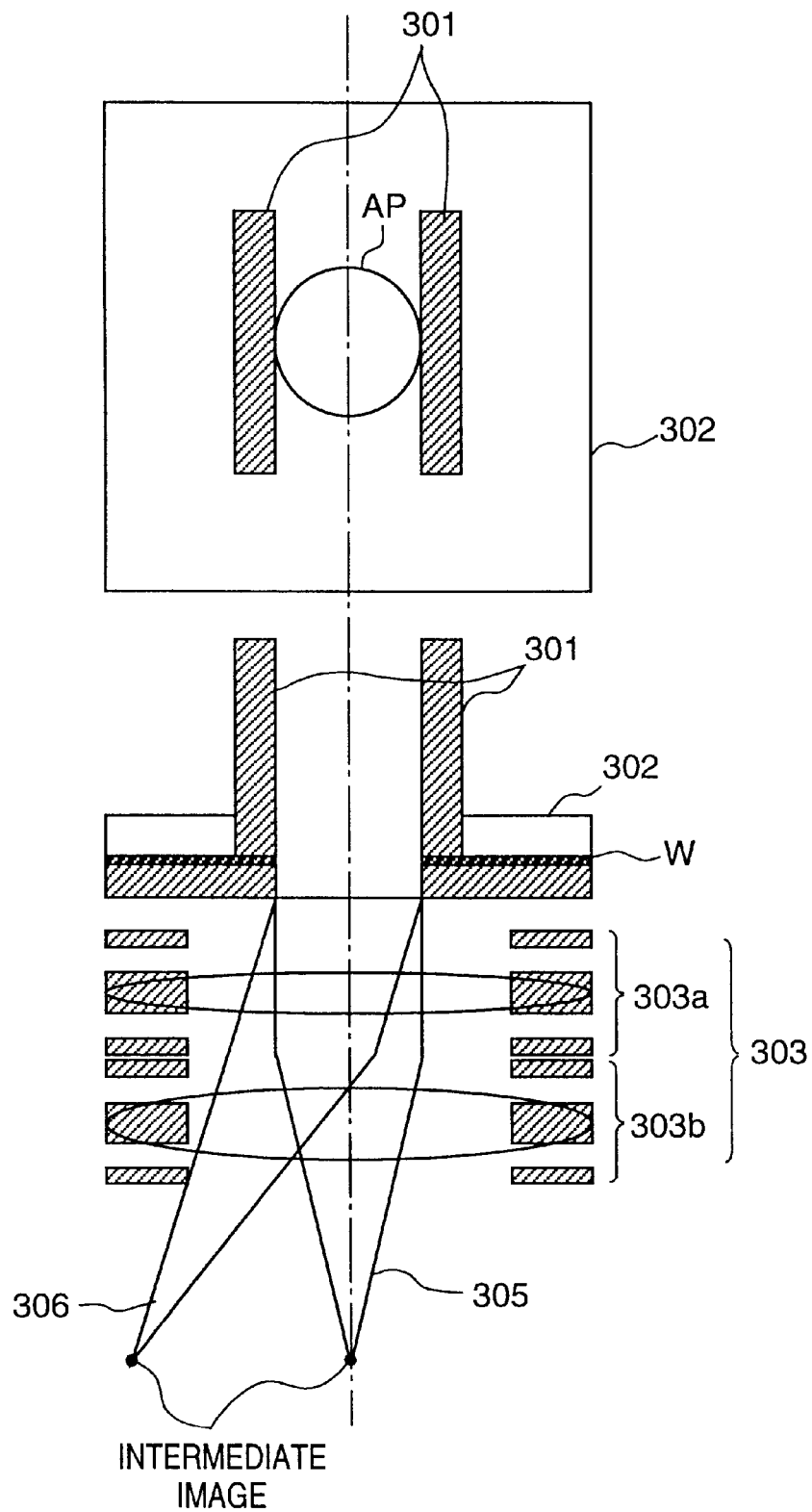
FIG. 3 is a sectional view of an element electron optical system.

FIG. 3 is a sectional view of each element electron optical system.

Referring to FIG. 3, reference numeral 301 denotes a blanking electrode which is made up of a pair of electrodes and has a deflection function; and 302, a board which has an aperture (AP) for defining the shape of an electron beam that passes therethrough, and is common to other element electron optical systems. On the board 302, the blanking electrode 301 and a wiring (W) for turning on/off the electrode are formed. Reference numeral 303 denotes an electron lens using two unipotential lenses 303a and 303b each of which is built by three aperture electrodes by setting the upper and lower electrodes at an identical acceleration potential V0 and maintaining the middle electrode at another potential V1 or V2, and has a convergence function.

Figure 4A:
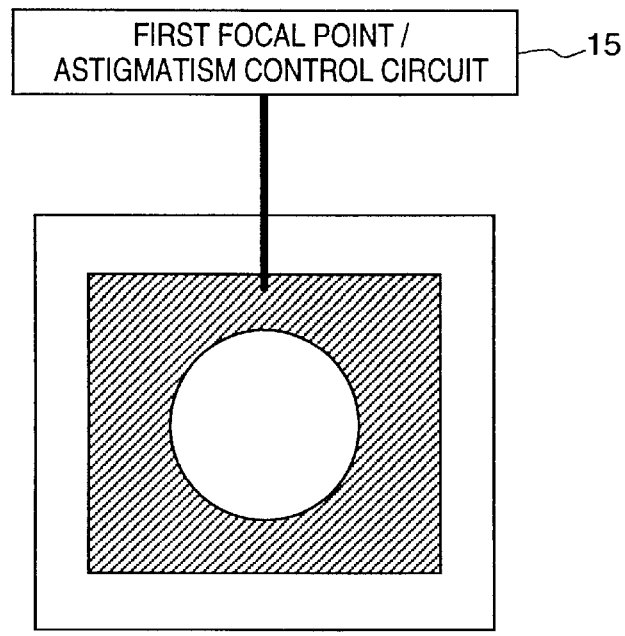
FIGS. 4A and 4B show electrodes of the element electron optical system.

The upper, middle, and lower electrodes of the unipotential lens 303a, and the upper and lower electrodes of the unipotential lens 303b have a shape, as shown in FIG. 4A, and the upper and lower electrodes of the unipotential lenses 303a and 303b are set at a common potential by a first focal point/astigmatism control circuit 15 (to be described later) in all the element electron optical systems.

Since the potential of the middle electrode of the unipotential lens 303a can be set by the first focal point/astigmatism control circuit 15 in units of element electron optical systems, the focal length of the unipotential lens 303a can be set in units of element electron optical systems.

Figure 4B:
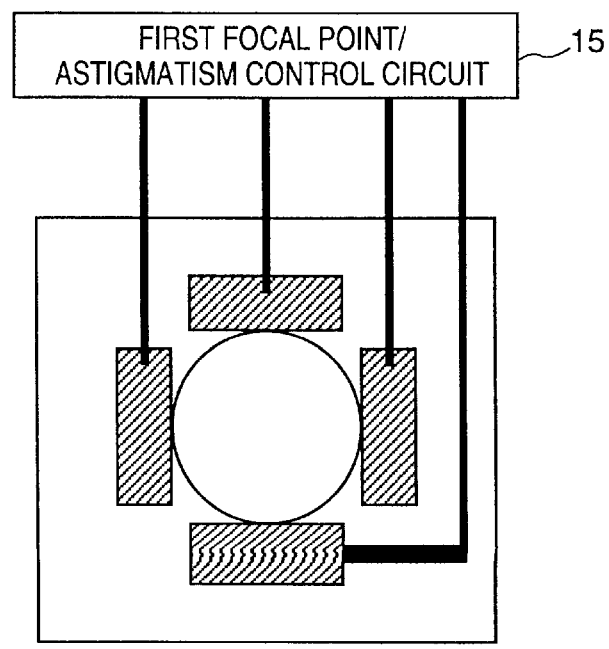

Also, since the middle electrode of the unipotential lens 303b is made up of four electrodes, as shown in FIG. 4B, and their potentials can be independently set by the first focal point/astigmatism control circuit 15 and can also be independently set in units of element electron optical systems, the unipotential lens 303b can have different focal lengths in a section perpendicular thereto and the focal lengths can also be independently set in units of element electron optical systems.

As a consequence, by independently controlling the middle electrodes of the element electron optical systems, the electron optical characteristics (intermediate image formation position, astigmatism) of the element electron optical systems can be controlled.

Electron beams which are converted into nearly collimated beams by the condenser lens 2 form intermediate images of the source by an electron lens 303 via the blanking electrode 301 and the aperture (AP). At this time, when no electric field is applied across the electrodes of the blanking electrode 301, the electron beams are not deflected like electron beams 305. On the other hand, when an electric field is applied across the electrodes of the blanking electrode 301, the electron beams are deflected like electron beams 306. Since the electron beams 305 and 306 have different angular distributions on the object surface of the reduction electron optical system 4, the electron beams 305 and 306 become incident on different regions at the pupil position (on a plane P in FIG. 1) of the reduction electron optical system 4. Hence, a blanking aperture BA that transmits the electron beams 305 alone is arranged at the pupil position (on the plane P in FIG. 1) of the reduction electron optical system.

The individual element electron optical systems respectively set the potentials of their two middle electrodes to correct curvature of field and astigmatism produced when the intermediate images formed thereby are projected onto the surface to be exposed by the reduction electron optical system 4 in a reduced scale, thereby varying their electron optical characteristics (intermediate image formation position and astigmatism). In this embodiment, however, in order to reduce the number of wiring lines between the middle electrodes and the first focal point/astigmatism control circuit 15, the element electron optical systems in a single subarray are set to have identical electron optical characteristics, and the electron optical characteristics (intermediate image formation position, astigmatism) of the element electron optical systems are controlled in units of subarrays.

Furthermore, in order to correct distortion produced when a plurality of intermediate images are projected onto the surface to be exposed by the reduction electron optical system 4 in a reduced scale, the distortion characteristics of the reduction electron optical system 4 are detected in advance, and the positions, in a direction perpendicular to the optical axis of the reduction electron optical system 4, of the individual element electron optical systems are set based on the detected characteristics.

Figure 5:
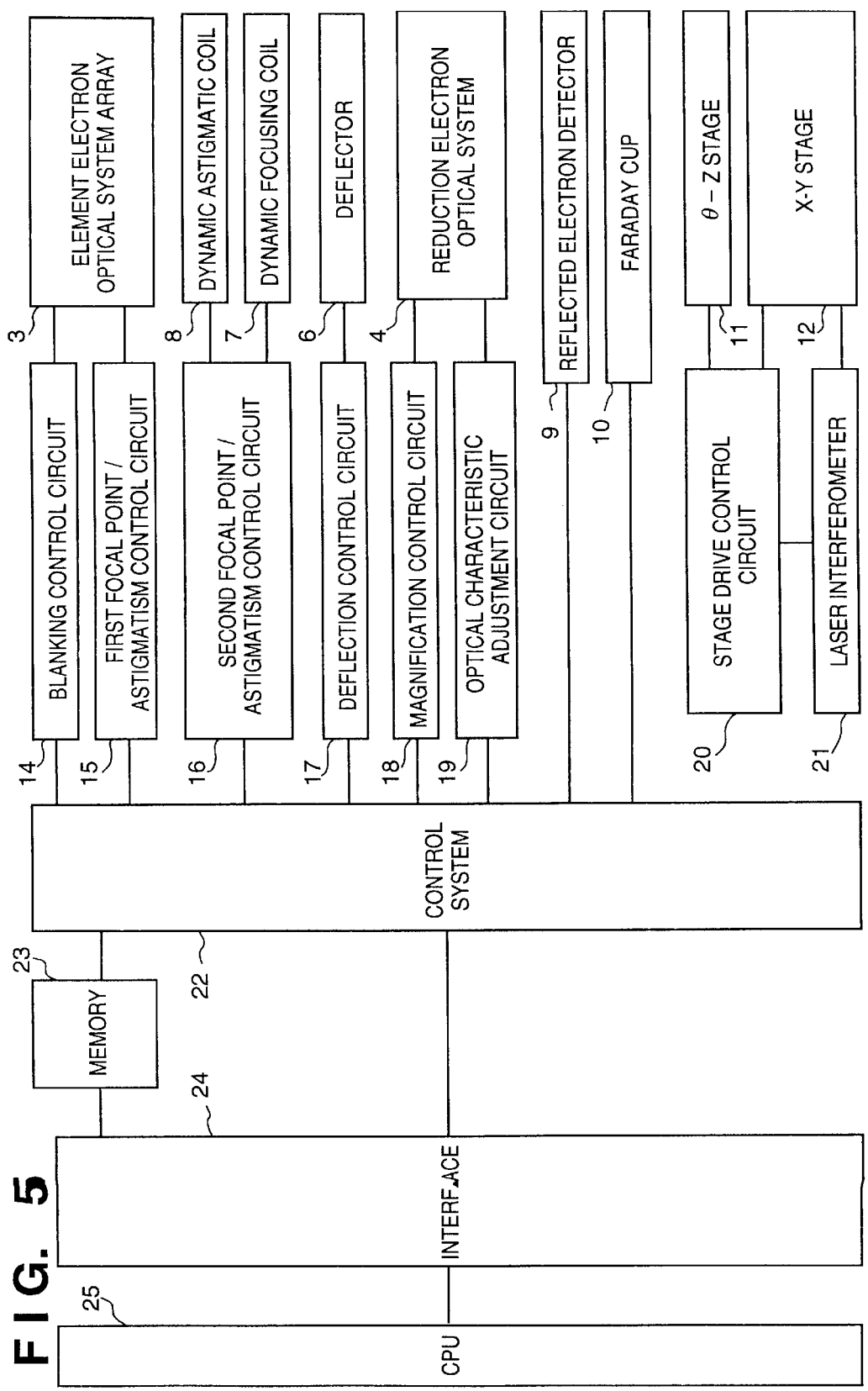
FIG. 5 shows the system arrangement of the electron beam exposure apparatus according to the present invention.

FIG. 5 shows the system arrangement of this embodiment.

A blanking control circuit 14 ON/OFF-controls the blanking electrodes of the individual element electron optical systems of the element electron optical system array 3. The first focal point/astigmatism control circuit 15 controls the electron optical characteristics (intermediate image formation position, astigmatism) of the individual element electron optical systems of the element electron optical system array 3.

A second focal point/astigmatism control circuit 16 controls the dynamic stigmatic coil 8 and the dynamic focusing coil 7 to control the focal point position and astigmatism of the reduction electron optical system 4. A deflection control circuit 17 controls the deflector 6. A magnification adjustment circuit 18 adjusts the magnification of the reduction electron optical system 4. An optical characteristic circuit 19 adjusts aberration of rotation and the optical axis by changing the energization current of an electromagnetic lens that builds the reduction electron optical system 4.

A stage driving control circuit 20 controls driving of the θ-Z stage, and also controls driving of the X-Y stage 12 in cooperation with a laser interferometer 21 for detecting the position of the X-Y stage 12.

A control system 22 synchronously controls the plurality of control circuits described above, the reflected electron detector 9, and the Faraday cup 10 so as to attain exposure and alignment on the basis of data read out from a memory 23 that stores information associated with a drawing pattern. The control system 22 is controlled via an interface 24 by a CPU 25 that controls the overall electron beam exposure apparatus.

[Operation]

Figure 6:
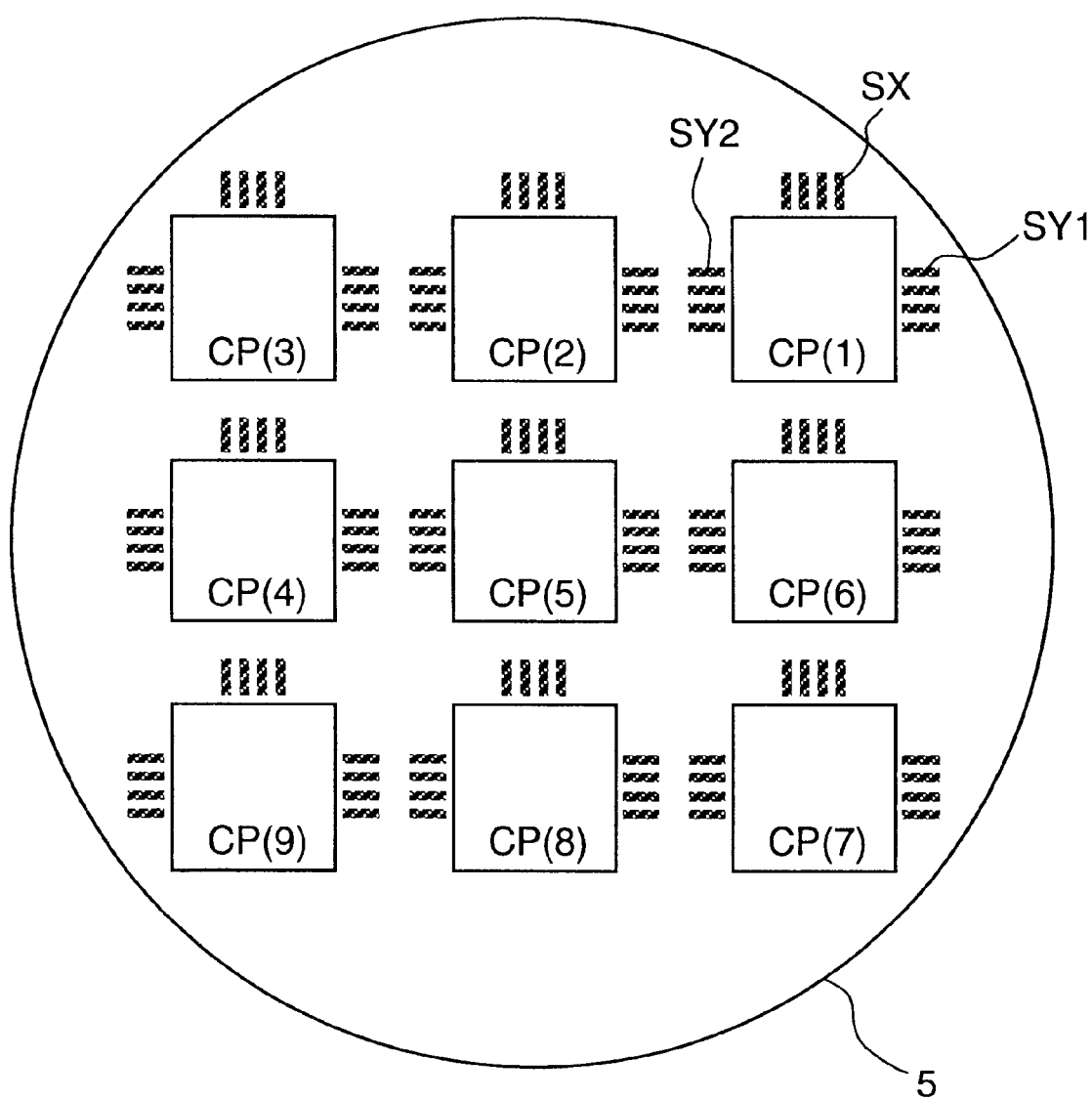
FIG. 6 shows alignment marks on a wafer.

On the wafer 5, a plurality of rectangular pattern regions CP are arranged in a matrix, as shown in FIG. 6. The individual pattern regions CP(1) to CP(9) are formed in advance with patterns which are determined to overlap the patterns to be drawn. On each pattern region CP, an alignment mark SX in the X-direction, an alignment mark SY1 in the Y-direction, and an alignment mark SY2 in the rotation direction within the X-Y plane are additionally formed. Each mark is a grating-like mark in which linear patterns are arranged at a pitch Pm ($\mu$m) in the measurement direction. If Pb represents the interval between adjacent ones of a plurality of electron beams on the wafer, as described above, the pitch of the linear patterns of each grating-like mark is set to attain Pb=N×Pm (N is a positive integer).

The operation of the electron beam exposure apparatus of this embodiment will be described below with reference to FIG. 5.

Upon multiple-exposure, the CPU 25 instructs, via the interface 24, the control system 22 to "execute alignment".

Figure 2:
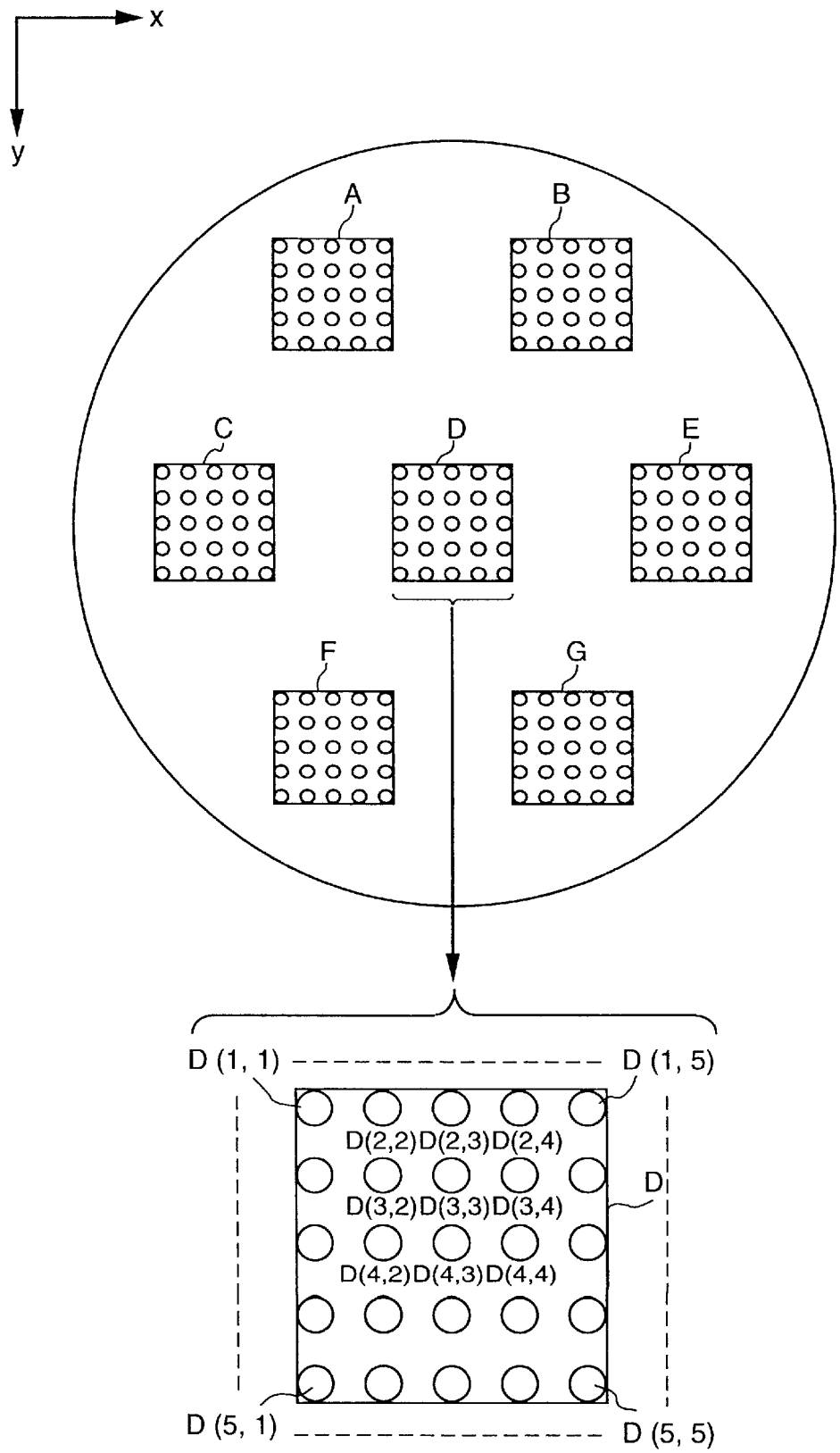
FIG. 2 is a plan view showing the arrangement of an element electron optical system array.

Note that the irradiation position, on the wafer, of the electron beam from the central element electron optical system D(3, 3) of the element electron optical system array 3 shown in FIG. 2 without any deflection is used as a beam reference position. The control system 22 instructs the stage driving control circuit 20 to move the X-Y stage 12 so as to locate the wafer 5, so that the central position of the mark SX of the pattern region CP(1) nearly matches the beam reference position.

The control system 22 instructs the blanking control circuit 14 to turn off the blanking electrodes of the corresponding element electron optical systems and to keep the blanking electrodes of other element electron optical systems ON so that nine electron beams alone from the element electron optical systems D(2, 2), D(2, 3), D(2, 4), D(3, 2), D(3, 3), D(3, 4), D(4, 2), D(4, 3), and D(4, 4) become incident on the wafer. In this embodiment, nine electron beams are used. Alternatively, only three beams from the element electron optical systems D(2, 3), D(3, 3), and D(4, 3), which have the same position (coordinates) in the measurement direction, and are arranged in a direction perpendicular to the measurement direction, may be used.

Figure 7A:
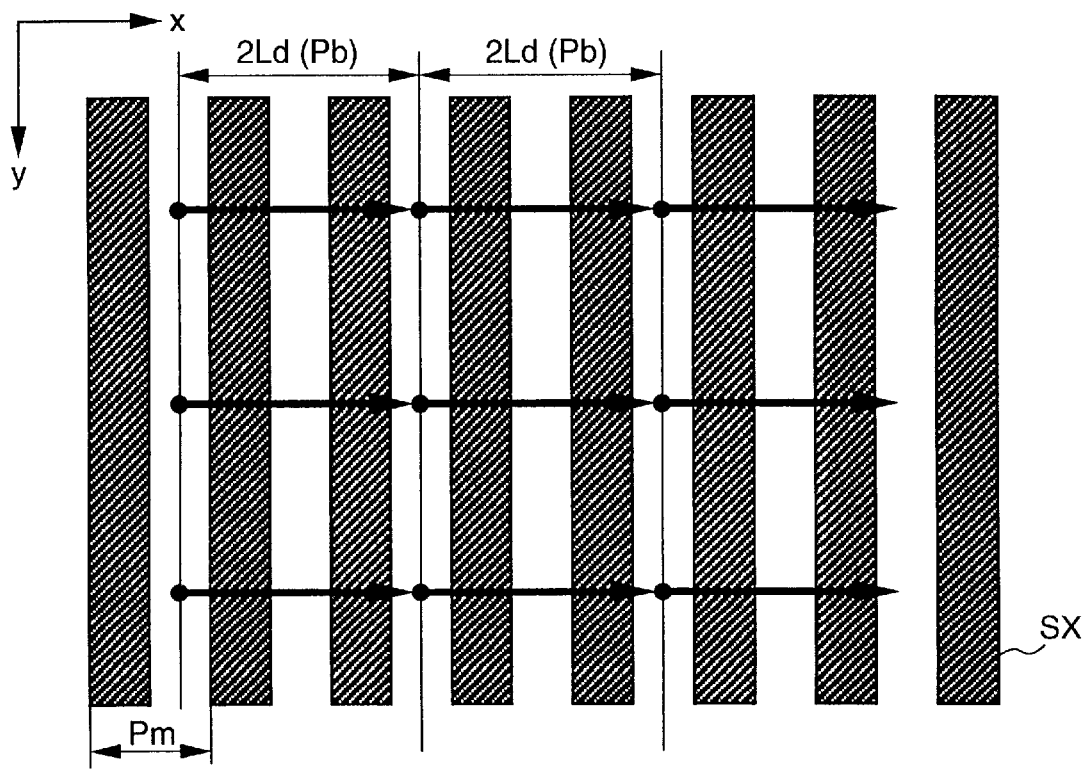
FIGS. 7A and 7B show the positional relationship between the alignment marks and the electron beam.

The nine electron beams become incident on the wafer, and at the same time, the control system 22 instructs the deflection control circuit 17 to displace (scan) the individual electron beams on the grating-like mark (SX) within a region of ±Ld ($\mu$m) to have the beam reference position of the individual electron beams as the center, as shown in FIG. 7A. Also, the control system 22 instructs the reflected electron detector 9 to simultaneously detect reflected electrons or secondary electrons from the grating-like mark positions corresponding to the electron beams by synthesizing them. The control system 22 stores discrete signal sequences (alignment signals) as signals of the detected electron quantities corresponding to the displacement. The sampling interval Ls ($\mu$m) of discrete electrical signals is determined based on the resolution of the deflector 6.

At this time, the start point positions (full circles in FIG. 7A) of the individual electron beams are at the same position (having an identical X-coordinate) in association with the measurement direction (X-direction) and/or their interval Pb in the X-direction satisfies Pb=K×Pm (K is a positive integer, and Pm is the pitch of the grating-like mark), as described above. As a consequence, since all the electron beams have identical positional relationships between their start point positions and the corresponding linear patterns to be scanned, substantially equal signals (alignment signals)

each indicating the relationship between the displacement amount and the detected electron quantity are obtained in correspondence with the individual electron beams. Furthermore, the discrete signals are Fourier-transformed to detect the phase of a periodic signal having a frequency determined by the pitch of the grating-like mark, as will be described later. In order to make this processing easy, the scanning region is set to satisfy 2Ld=M×Pm (M is a positive integer) and 2Ld=N×Ls (N is a positive integer, M<N).

Figure 7B:
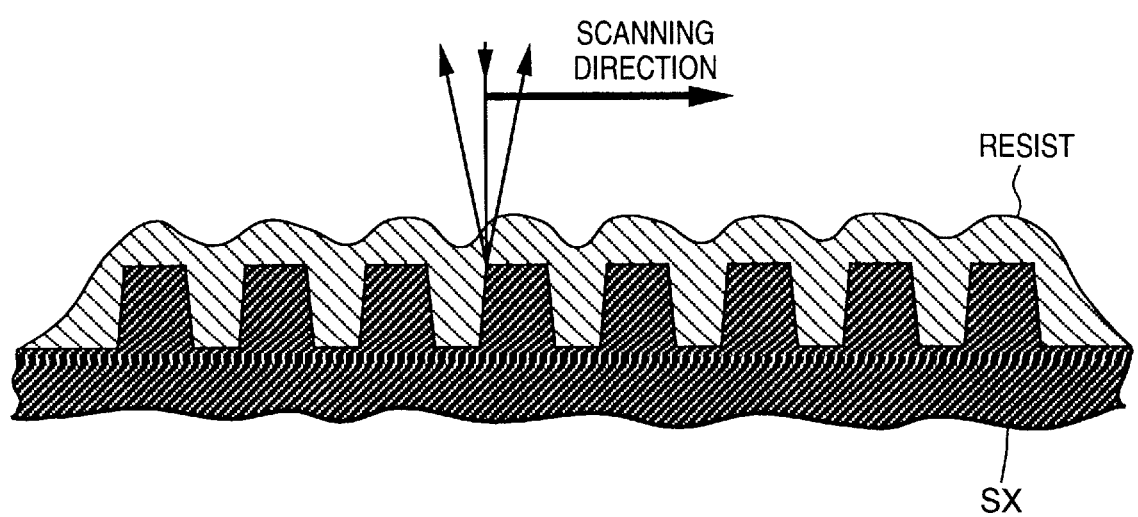

As shown in FIG. 7B, the sectional structures of the linear patterns at both ends of the grating-like pattern tend to distort as compared to other linear patterns, and the shape of the resist that covers such patterns tends to distort. In view of this problem, in this embodiment, the scanning region of the electron beam is set to be a region except for linear patterns at both ends of the grating-like mark.

FIG. 8A shows discrete signal sequences (alignment signals) obtained by individually scanning the electron beams. The alignment signals have nearly equal shapes, but suffer different distortions depending on the sectional structures of the scanned linear patterns and different resist shapes that cover them. Also, different random noise components are superposed on the alignment signals.

In this embodiment, however, since the reflected electrons or secondary electrons from the linear patterns corresponding to the electron beams are synthesized and are simultaneously detected by the reflected electron detector 9, a discrete electrical signal sequence S(x) (alignment signal) which suffers less distortion and in which random noise is reduced is obtained, as shown in FIG. 8B.

The control system 22 transforms the obtained discrete electrical signal sequence S(x) into a signal in the spatial frequency domain by discrete Fourier transformation to calculate Fourier coefficients of a frequency (1/Pm) determined by the pitch of the grating-like mark.

This scheme is known to those who are skilled in the art. That is, as can be seen from the above description, since 1/Pm=M/2Ld holds when the sampling frequency ½Ld is normalized to 1, the spatial frequency of a periodic signal determined by the pitch of the grating-like mark is M, and complex-valued Fourier coefficients X(M) of spatial frequency M are written:

$$X(M) = \Sigma S(n \times Ls) e^{-j2p(M/N)(n \times Ls)}$$

(where j is an imaginary number unit).
The strength E(M) and phase θ(M) of the periodic signal at that time are respectively:

$$E(M) = ((Re(X(M))^2 + (Im(X(M))^2)$$

$$\theta(M) = \tan^{-1}(Im(X(M))/(Re(X(M))))$$

(where Re(X(M)) and Im(X(M)) respectively represent the real part and imaginary part of a complex-valued X(k)).

A deviation DX, in the X-direction, of the central position of the grating-like mark SX from the reference position of the electron beam from the element electron optical system D(3, 3) is calculated from the phase θ(M) of the periodic signal having the frequency 1/Pm obtained by the above-mentioned scheme using the following equation:

$$DX = Pm \times (\theta(M)/2p).$$

The control system 22 controls the stage driving control circuit 20 to move the individual grating-like marks SY1 and SY2 in turn to the beam reference position of the electron beam from the element electron optical system D(3, 3) on the basis of the designed relative positions of the grating-like marks SY1 and SY2 with respect to the grating-like mark SX by the same method as described above, and to detect the deviations of the grating-like marks SY1 and SY2 with respect to the beam reference position, thereby detecting the positional relationships of the grating-like marks SY1 and SY2 with respect to the beam reference position.

The control system 22 then controls the stage driving control circuit 20 to move the wafer 5 on the basis of the positional relationships of the grating-like marks SX, SY1, and SY2 with respect to the beam reference position, so that the beam reference positions of the plurality of electron beams from the element electron optical system array 3 are located at a desired position of the pattern region CP(1).

Subsequently, when the CPU 25 instructs, via the interface 24, the control system 22 to "execute exposure", the control system 22 executes the following steps.
(Step 1)
The control system 22 controls the deflection control circuit 17 to deflect a plurality of electron beams from the element electron optical system array using the sub deflector of the deflector 6, and also controls the blanking control circuit 14 to turn on/off the blanking electrodes of the individual element electron optical systems in correspondence with the pattern to be exposed on the wafer 5. At this time, the X-Y stage 12 is continuously moved in the X- or Y-direction, and the deflection control circuit 17 controls the deflection positions of the electron beams as well as the moving amount of the X-Y stage 12.

Figure 9:
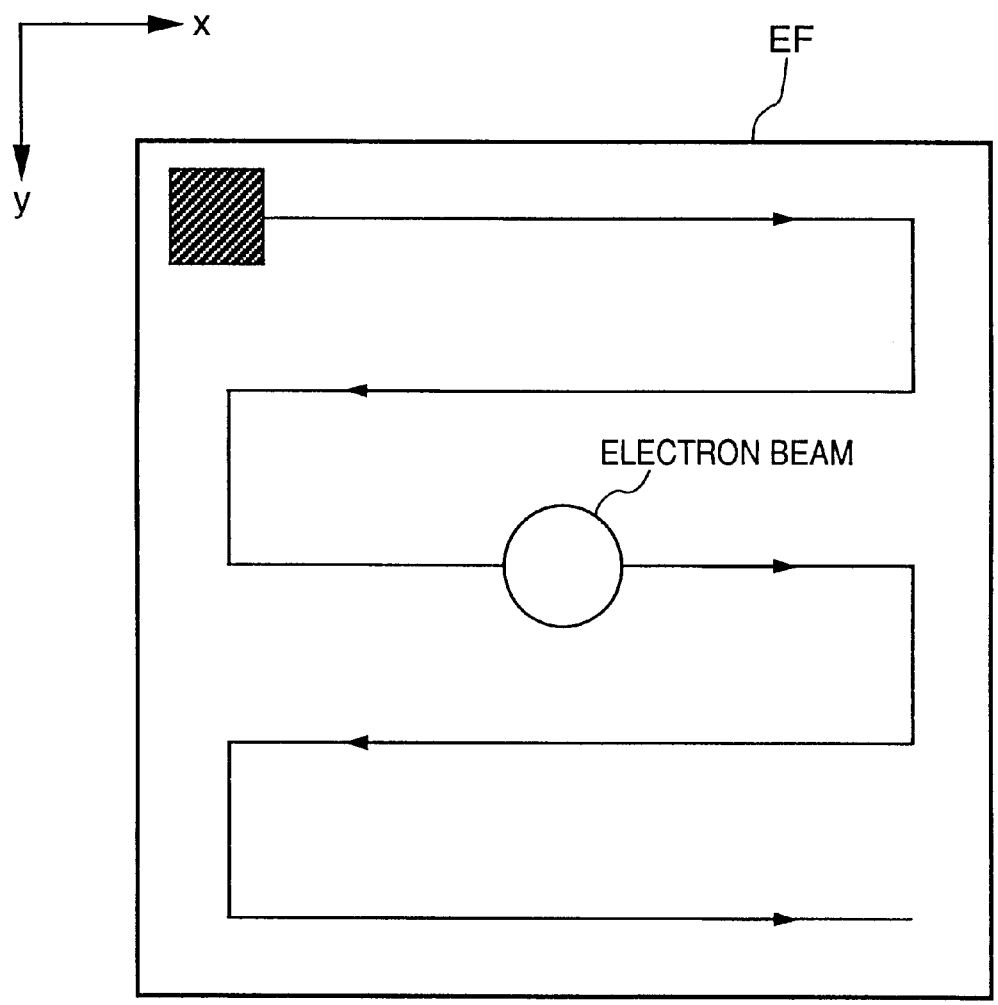
FIG. 9 shows an exposure field (EF)
Figure 10:
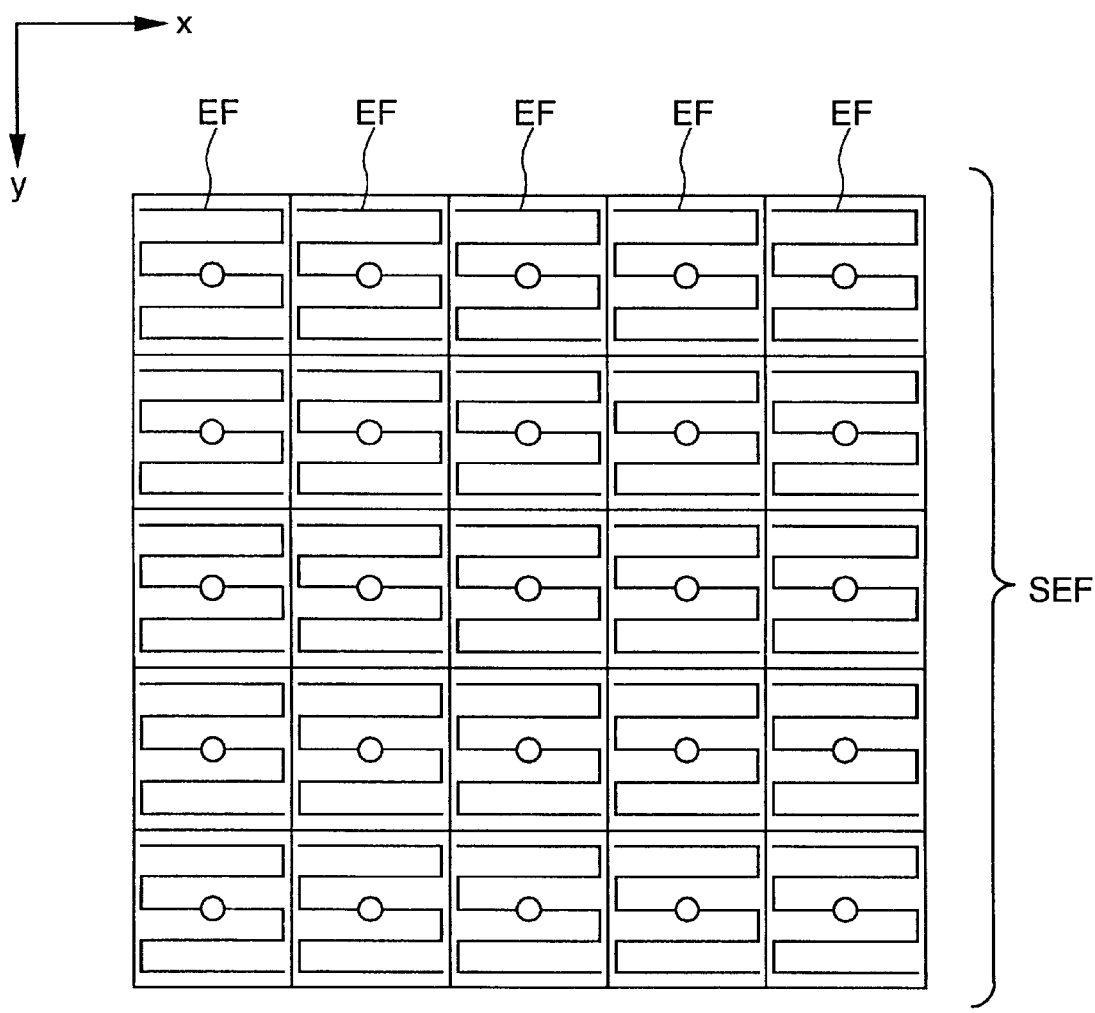
FIG. 10 shows a sub-array exposure field (SEF)
Figure 11:
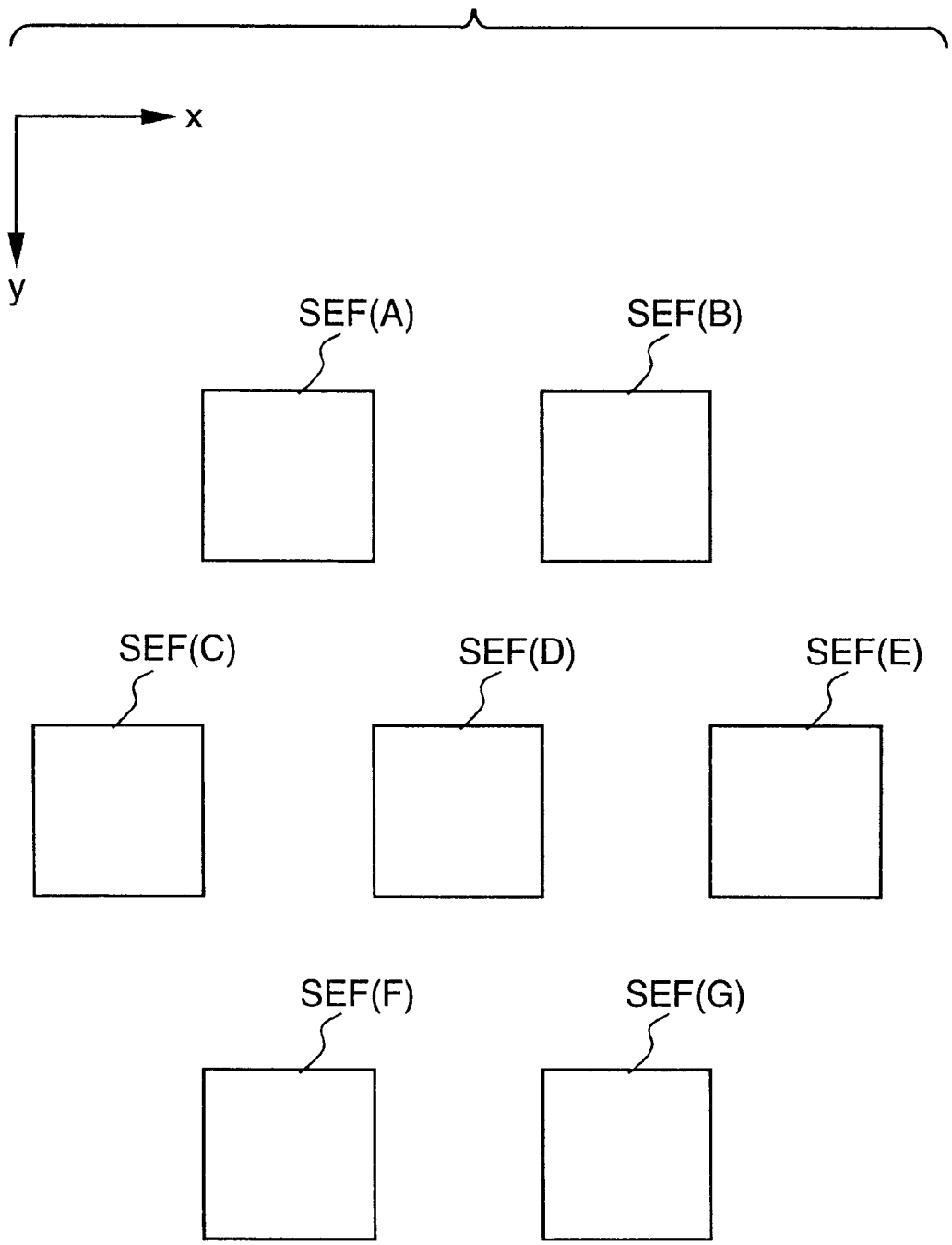
FIG. 11 shows a sub field.
Figure 12:
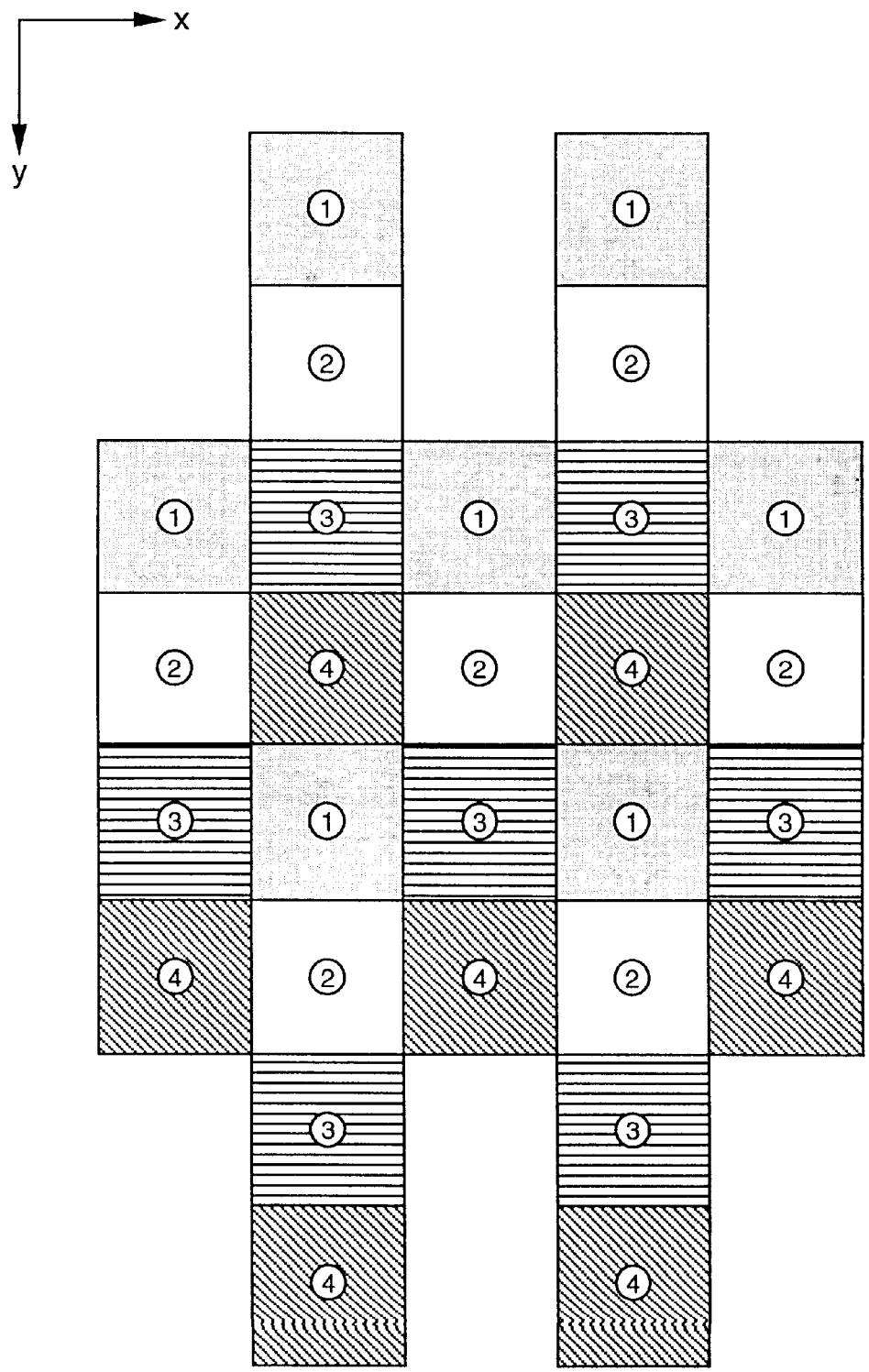
FIG. 12 is a view for explaining exposure on the entire surface of the wafer.

As a result, the electron beam from one element electron optical system scans/exposes an exposure field (EF) on the wafer 5 to have a full square as the start point, as shown in FIG. 9. A plurality of electron beams of one subarray expose a subarray exposure field (SEF) made up of the exposure fields of the element electron optical systems in the subarray, as shown in FIG. 10. As a result, on the wafer 5, a subfield having a plurality of subarray exposure fields (SEF) is formed by exposure, as shown in FIG. 11.
(Step 2)
The control system 22 instructs the deflection control circuit 17 to deflect a plurality of electron beams from the element electron optical system array using the main deflector of the deflector 6 so as to expose subfield ① and thereafter, expose subfield ②, as shown in FIG. 12. At this time, the control system 22 instructs the second focal point/astigmatism control circuit 16 to control the dynamic focusing coil 7 on the basis of predetermined dynamic focal point correction data so as to correct the focal point position of the reduction electron optical system 4, and to control the dynamic stigmatic coil 8 on the basis of predetermined dynamic astigmatism correction data so as to correct the astigmatism of the reduction electron optical system. Thereafter, the control system 22 executes the operations in step 1 to expose subfield ②.

By repeating steps 1 and 2 above, the subfields are sequentially exposed like subfields ③ and ④, as shown in FIG. 12, thereby exposing the entire surface of the wafer.

Second Embodiment

In the first embodiment, the nine electron beams are deflected to scan the grating-like mark (SX), and reflected electrons or secondary electrons from the grating-like mark positions corresponding to the electron beams are synthesized and simultaneously detected by the reflected electron detector 9. However, in this embodiment, the X-Y stage 12 is moved by the stage driving control circuit 20 to scan nine electron beams on the grating-like mark (SX), and reflected electrons or secondary electrons from the grating-like mark positions corresponding to the electron beams are synthesized and simultaneously detected by the reflected electron detector 9. Then, alignment signals as signals of the detected electron quantities corresponding to the positions of the X-Y stage 12 are stored. Other operations are the same as those in the first embodiment.

Third Embodiment

Figure 13:
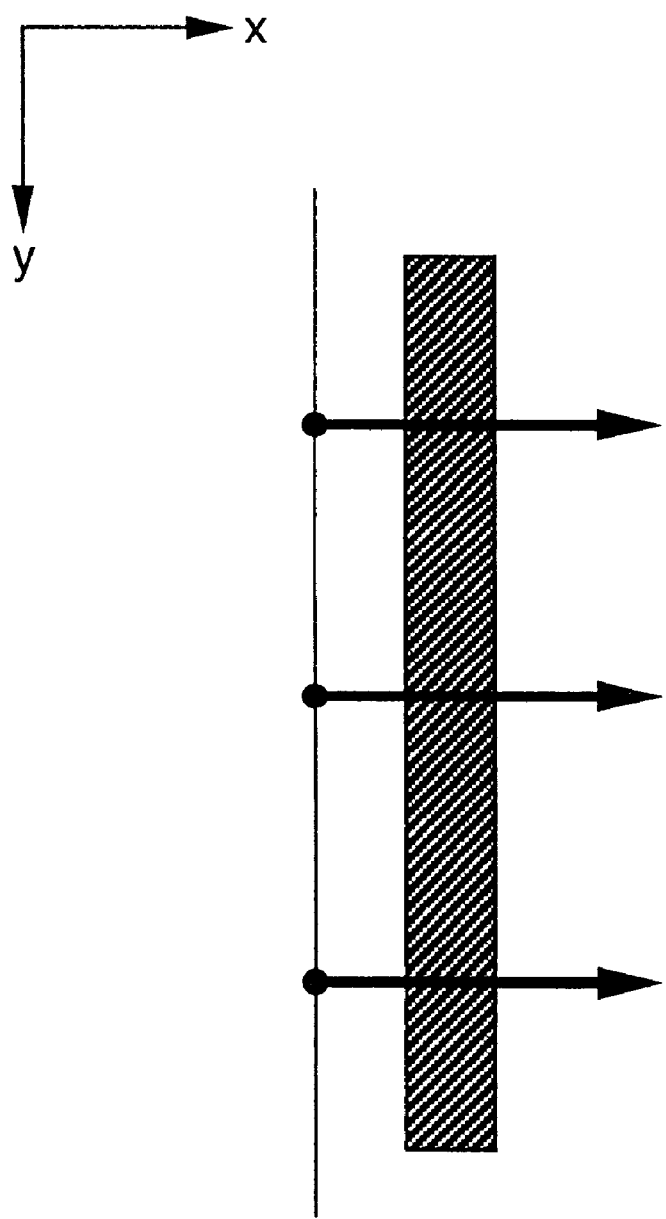
FIG. 13 shows the relationship between the alignment mark and the electron beam according to the third embodiment of the present invention.

In the first embodiment, the nine electron beams are deflected to scan the grating-like mark (SX). Alternatively, in this embodiment, as shown in FIG. 13, three electron beams which have identical start point positions with respect to the measurement direction are scanned on linear patterns, and reflected electrons or secondary electrons from the grating-like mark positions corresponding to the electron beams are synthesized and simultaneously detected by the reflected electron detector 9. Furthermore, in this embodiment, the deviation, in the X-direction, of the central position of the linear patterns from the reference position of the electron beam from the element electron optical system D(3, 3) is detected by processing the obtained discrete signals (alignment signals) using the conventional slice level method or correlation method.

As described above, according to the first to third embodiments of the present invention, the position of the alignment mark can be detected while reducing the influence of distortion of the sectional structure of the alignment mark or the coating state of the resist that covers the alignment mark.

Accordingly, high-precision alignment between the patterns can be realized.

Fourth Embodiment

The fourth embodiment according to the present invention will be described below. In this embodiment, electron beams are irradiated onto a mark, and the imaging states of the electron beams are corrected on the basis of reflected electrons or secondary electrons from the mark. Note that the electron beam exposure apparatus according to this embodiment has the same hardware arrangement as that of the electron beam exposure apparatus according to each of the first to third embodiments. Also, this embodiment can be combined with the alignment mark detection method according to one of the first to third embodiments.

As shown in FIGS. 14A to 14C, marks M are formed on the stage reference plate 13 at positions corresponding to nine regions, which are defined by dividing the deflection region of the main deflector of the deflector 6 to have the center of the deflection region as (0, 0). Each mark M includes a grating-like mark MX formed by arranging linear patterns in the X-direction (see FIG. 14B), and a grating-like mark MY formed by arranging linear patterns in the Y-direction (see FIG. 14C). Each grating-like mark has a pitch Pm ($\mu$m) of linear patterns.

In this embodiment, prior to exposure of a wafer, the CPU 25 instructs, via the interface 24, the control system 22 to execute "calibration". In response to this instruction, the control system executes the following processing.

Note that the irradiation position, on the wafer, of the electron beam from the central element electron optical system D(3, 3) of the element electron optical system array 3 shown in FIG. 2 without any deflection is used as a beam reference position. The control system 22 instructs the stage driving control circuit 20 to move the X-Y stage 12 so as to locate the center of the mark M(0, 0) of the stage reference plate 13 at this beam reference position.

Figure 15:
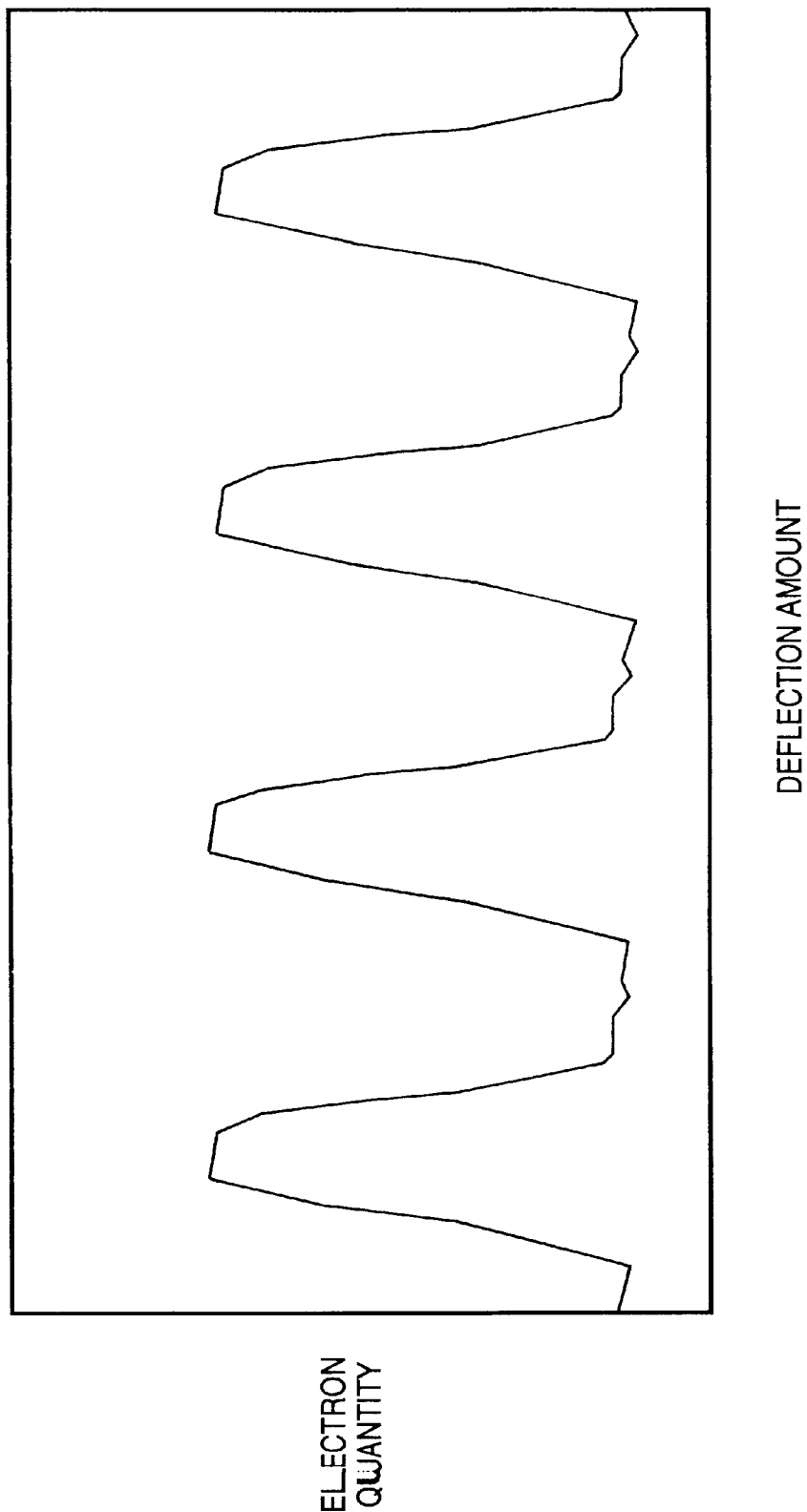
FIG. 15 shows a mark signal.

The control system 22 then instructs the blanking control circuit 14 and the deflection control circuit 17 to deflect three electron beams, i.e., an electron beam B0 coming from the element electron optical system D(3, 3) and electron beams BX1 and BX2 coming from the element electron optical systems D(2, 3) and D(4, 3) arranged in the Y-direction with respect to the element electron optical system D(3, 3), to the position of the mark M(1, 1) using the main deflector of the deflector 6. The three electron beams are scanned on the mark MX of the mark M(1, 1) in the X-direction, as shown in FIG. 14B, and reflected electrons or secondary electrons from the grating-like mark corresponding to the electron beams are synthesized and simultaneously detected by the reflected electron detector 9 as a mark signal. The mark signal is accessed by the control system 22. FIG. 15 shows this mark signal.

The control system 22 stores the mark signal (discrete signal sequence) as the signal of the detected electron quantity corresponding to the deflection amount. The sampling interval Ls ($\mu$m) of the discrete electrical signals is determined based on the resolution of the deflector 6.

At this time, the start point positions (open circles in FIG. 14B) are located at an identical position in the X-direction and/or their interval in the X-direction satisfies Pb=K×Pm (K is a positive integer, and Pm is the pitch of the grating-like mark). As a consequence, since all the electron beams have identical positional relationships between their start point positions and the grating-like mark to be scanned, signals indicating the relationships between the deflected amount and the detected electron quantities of the individual electron beams nearly equal each other. The mark signal obtained by synthesizing these signals has smaller noise components and a larger signal magnitude than those of a single electron beam due to the averaging effect. The discrete signal (mark signal) is Fourier-transformed to detect the defocus amounts (imaging states) of electron beams. In order to make this processing easy, the scanning width 2Ld is set to satisfy 2Ld=M×Pm (M is a positive integer) and 2Ld=N×Ls (N is a positive integer, M<N).

The control system 22 transforms the obtained discrete electrical signal sequence S(x) into a signal in the spatial frequency domain by discrete Fourier transformation to calculate Fourier coefficients of a frequency (1/Pm) determined by the pitch of the linear patterns of the grating-like mark.

This scheme is known to those who are skilled in the art. That is, as can be seen from the above description, since 1/Pm=M/2Ld holds when the sampling frequency ½Ld is normalized to 1, the spatial frequency of a periodic signal determined by the pitch of the grating-like mark is M, and complex-valued Fourier coefficients X(M) of spatial frequency M are written:

$$X(M)=\Sigma S(n \times Ls)e^{-j2p(M/N)(n \times Ls)}$$

(where j is an imaginary number unit).

The strength E(M) and phase $\theta$(M) of the periodic signal at that time are respectively:

$$E(M)=((Re(X(M))^2+(Im(X(M))^2)$$

$$\theta(M)=\tan^{-1}(Im(X(M))/(Re(X(M))))$$

(where Re(X(M)) and Im(X(M)) respectively represent the real part and imaginary part of a complex-valued X(k)).

The strength E(M) of the periodic signal of the frequency 1/Pm obtained by the above-mentioned scheme assumes a smaller value as the defocus amount of the electron beam is larger, or assumes a larger value when the defocus amount of the electron beam is smaller. The control system 22 stores the strength E(M) representing the defocus amount of the electron beam.

On the other hand, the control system 22 instructs the blanking control circuit 14 and the deflection control circuit 17 to deflect three electron beams, i.e., the electron beam B0 coming from the element electron optical system D(3, 3) and electron beams BY1 and BY2 coming from the element electron optical systems D(3, 2) and D(3, 4) arranged in the X-direction with respect to the element electron optical system D(3, 3), to the position of the mark M(1, 1) using the main deflector of the deflector 6. The three electron beams are scanned on the mark MY of the mark M(1, 1) in the Y-direction, as shown in FIG. 14C, and reflected electrons or secondary electrons from the grating-like mark corresponding to the electron beams are synthesized and simultaneously detected by the reflected electron detector 9. Then, a mark signal is input to the control system 22. The mark signal (discrete signal sequence) S(y) as the signal of the detected electron quantity corresponding to the deflected amount is stored, and the stored discrete signal sequence S(y) is transformed into a signal in the spatial frequency domain by discrete Fourier transformation, thereby storing the strength E(M) of the periodic signal of the frequency (1/Pm) determined by the pitch of the linear patterns of the grating-like mark.

Figure 16:
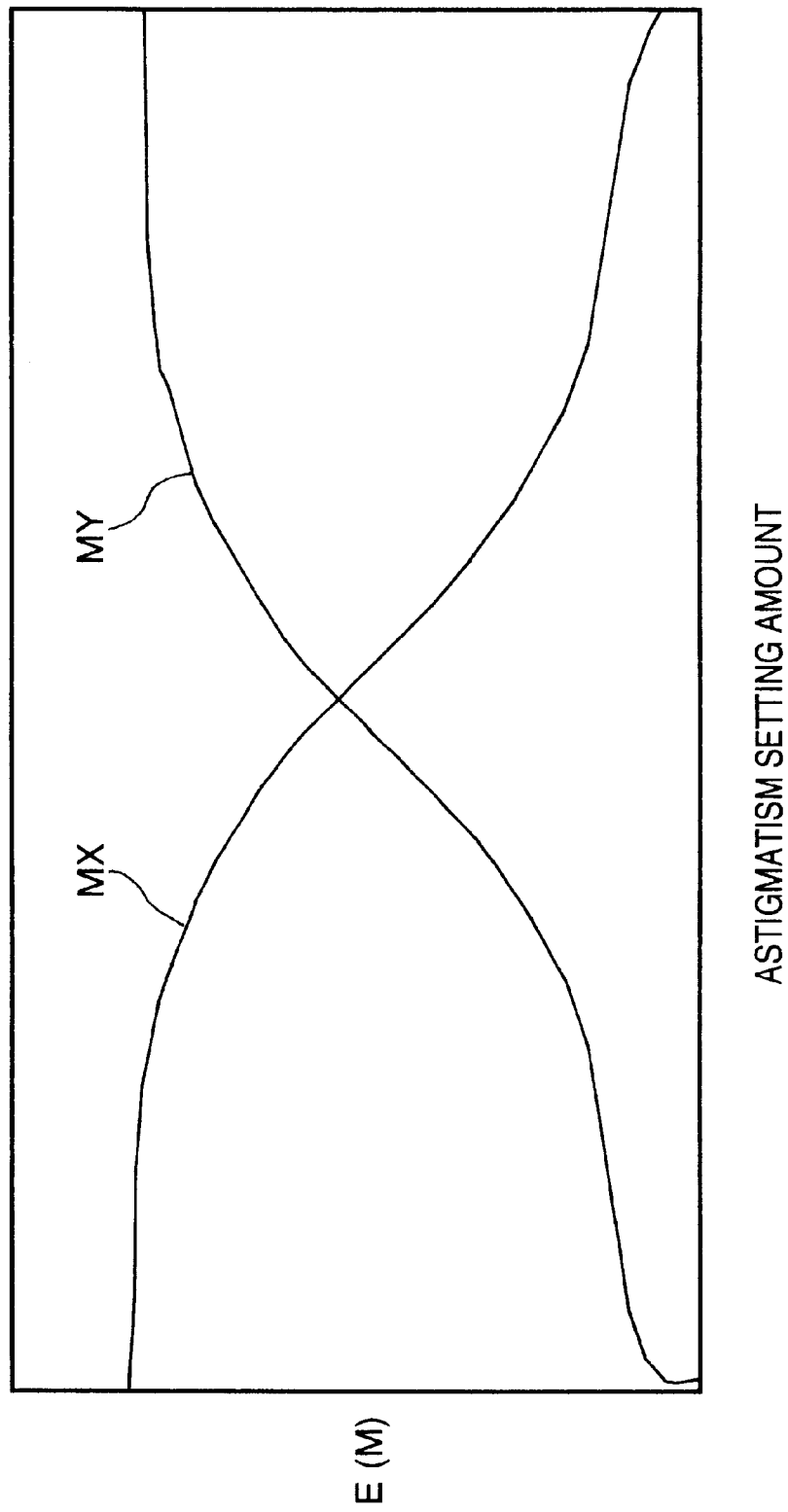
FIG. 16 shows the relationship between the astigmatism setting amount and the Fourier coefficient strength.

Next, the control system 22 instructs the second focal point/astigmatism control circuit 16 to change the setting of the dynamic stigmatic coil 8 (to change the dynamic astigmatism correction data), and similarly stores the strengths E(M) obtained using the marks MX and MY upon scanning the mark M(1, 1) with the electron beams again. By repeating such operations, the relationship between the astigmatism setting amount of the dynamic stigmatic coil 8 and the strength E(M) obtained using the mark MX, and the relationship between the astigmatism setting amount of the dynamic stigmatic coil 8 and the strength E(M) obtained using the mark MY are obtained, as shown in FIG. 16. Then, dynamic astigmatism correction data when the strengths E(M) obtained using the marks MX and MY match each other is calculated. In this manner, optimal dynamic astigmatism correction data at the deflection position corresponding to the mark M(1, 1) is determined.

The above-mentioned operations are repeated for all the marks, thus determining optimal dynamic astigmatism correction data at the deflection positions corresponding to the individual marks.

In this manner, since the dynamic astigmatism correction data is calculated based on the strength E(M) of the periodic signal of the frequency determined by the pitch of the linear patterns of each grating-like mark, the obtained mark signal is hardly influenced by noise included therein.

The control system 22 instructs the blanking control circuit 14 and the deflection control circuit 17 to deflect three electron beams, i.e., the electron beam B0 and the electron beams BX1 and BX2 to the position of the mark M(1, 1) using the main deflector of the deflector 6. At this time, the dynamic stigmatic coil 8 is controlled based on the dynamic astigmatism correction data obtained by the above-mentioned operations.

Subsequently, the three electron beams are scanned on the mark MX of the mark M(1, 1) in the X-direction, as shown in FIG. 14B, and reflected electrons or secondary electrons from the grating-like mark corresponding to the electron beams are synthesized and simultaneously detected by the reflected electron detector 9. The detected mark signal is input by the control system 22. The mark signal (discrete signal sequence) S(x) as the signal of the detected electron quantity corresponding to the deflected amount is stored, and the stored discrete signal sequence S(x) is transformed into a signal in the spatial frequency domain by discrete Fourier transformation, thereby storing the strength E(M) of the periodic signal of the frequency (1/Pm) determined by the pitch of the linear patterns of the grating-like mark.

Also, the control system 22 instructs the blanking control circuit 14 and the deflection control circuit 17 to deflect three electron beams, i.e., the electron beam B0 and the electron beams BY1 and BY2 to the position of the mark M(1, 1) using the main deflector of the deflector 6. Then, the three electron beams are scanned on the mark MY of the mark M(1, 1) in the Y-direction, as shown in FIG. 14C, and reflected electrons or secondary electrons from the grating-like mark corresponding to the electron beams are synthesized and simultaneously detected by the reflected electron detector 9. The detected mark signal is input by the control system 22. The mark signal (discrete signal sequence) S(y) as the signal of the detected electron quantity corresponding to the deflected amount is stored, and the stored discrete signal sequence S(y) is transformed into a signal in the spatial frequency domain by discrete Fourier transformation, thereby storing the strength E(M) of the periodic signal of the frequency (1/Pm) determined by the pitch of the linear patterns of the grating-like mark.

Figure 17:
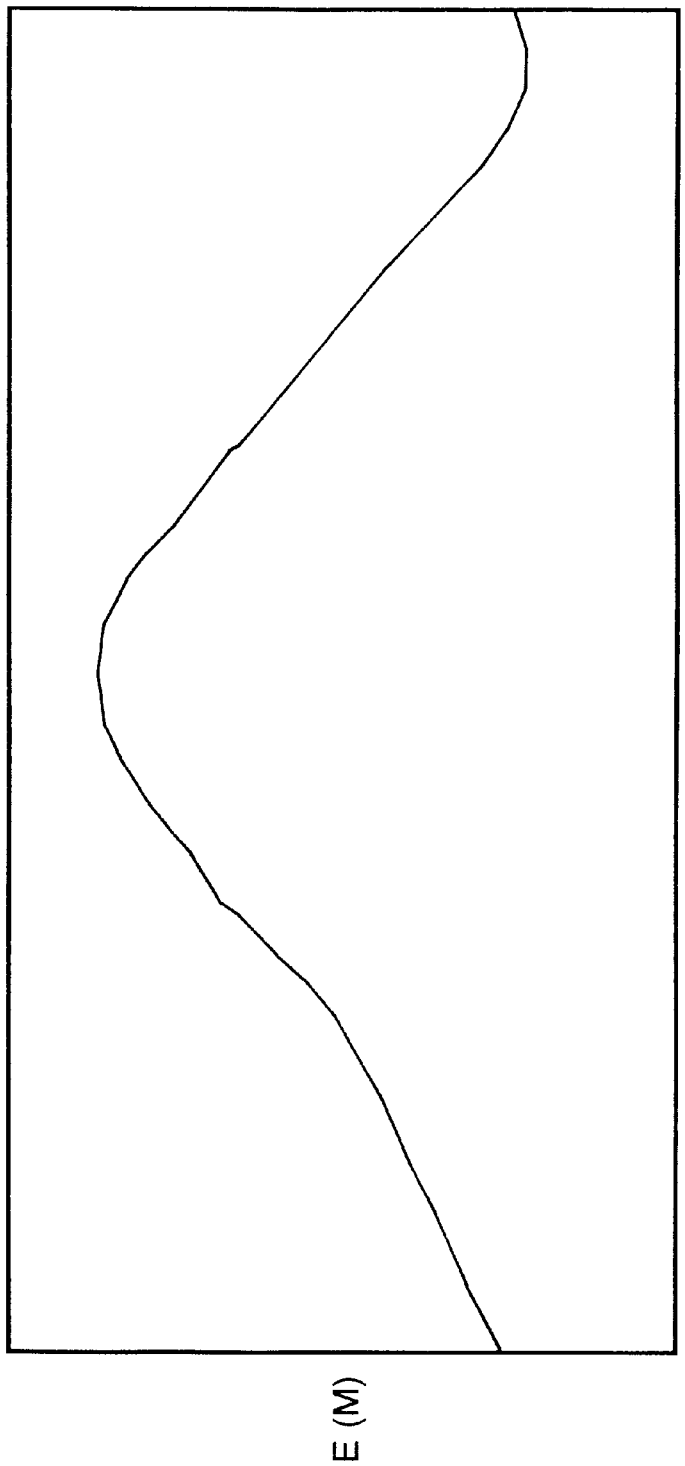
FIG. 17 shows the relationship between the focal point setting amount and the Fourier coefficient strength.

Finally, the control system 22 instructs the second focal point/astigmatism control circuit 16 to change setting of the dynamic focusing coil 7 (to change dynamic focal point correction data), and similarly stores the strengths E(M) obtained using the marks MX and MY upon scanning the mark M(1, 1) with the electron beams again. By repeating such operations, the relationship between the focal point setting amount of the dynamic focusing coil 7 and the strength E(M) obtained using the mark MX is obtained, as shown in FIG. 17. Thereafter, the control system 22 calculates dynamic focal point correction data corresponding to the maximum strength E(M). In this manner, optimal dynamic focal point correction data at the deflection position corresponding to the mark M(1, 1) is determined.

The above-mentioned operations are repeated for all the marks, thus determining optimal dynamic focal point correction data at the deflection positions corresponding to the individual marks.

As described above, since the dynamic focal point correction data is obtained based on the strength E(M) of the periodic signal of the frequency determined by the linear patterns of each grating-like mark, the obtained mark signal is hardly influenced by noise included therein.

Subsequently, when the CPU 25 instructs, via the interface 24, to "execute exposure", the control system executes the following steps.

(Step 1)

The control system 22 controls the deflection control circuit 17 to deflect a plurality of electron beams from the element electron optical system array using the sub deflector of the deflector 6, and also controls the blanking control circuit 14 to turn on/off the blanking electrodes of the individual element electron optical systems in correspondence with the pattern to be exposed on the wafer 5. At this time, the X-Y stage 12 is continuously moved in the X- or Y-direction, and the deflection control circuit 17 controls the deflection positions of the electron beams as well as the moving amount of the X-Y stage 12.

As a consequence, the electron beam from one element electron optical system scans/exposes an exposure field (EF) on the wafer 5 to have a full square as the start point, as shown in FIG. 9. The exposure fields (EF) of a plurality of element electron optical systems in each subarray are set adjacent to each other, as shown in FIG. 10, and consequently, a subarray exposure field (SEF) made up of a plurality of exposure regions (EF) is formed by exposure on the wafer 5. At the same time, a subfield made up of subarray exposure fields (SEF) respectively formed by subarrays A to G is formed on the wafer 5 by exposure, as shown in FIG. 11.

(Step 2)

The control system 22 instructs the deflection control circuit 17 to deflect a plurality of electron beams from the element electron optical system array using the main deflector of the deflector 6 so as to expose subfield ① and thereafter, expose subfield ②, as shown in FIG. 12. At this time, the control system 22 instructs the second focal point/astigmatism control circuit 16 to control the dynamic focusing coil 7 on the basis of the dynamic focal point correction data obtained by the above-mentioned operations, and to control the dynamic stigmatic coil 8 on the basis of the dynamic astigmatism correction data obtained by the above-mentioned operations, thereby correcting the astigmatism of the reduction electron optical system. Thereafter, the control system 22 executes the operations in step 1 to expose subfield ②.

By repeating steps 1 and 2 above, the subfields are sequentially exposed like subfields ③ and ④, as shown in FIG. 12, thereby exposing the entire surface of the wafer.

As described above, according to the fourth embodiment of the present invention, since the imaging state of the reduction electron optical system can be accurately detected, the reduction electron optical system can be appropriately corrected using high-precision imaging state correction data and desired patterns can be drawn on the wafer.

Fifth Embodiment

An embodiment of a device manufacturing method using the above-mentioned electron beam exposure apparatus and exposure method will be explained below.

Figure 18:
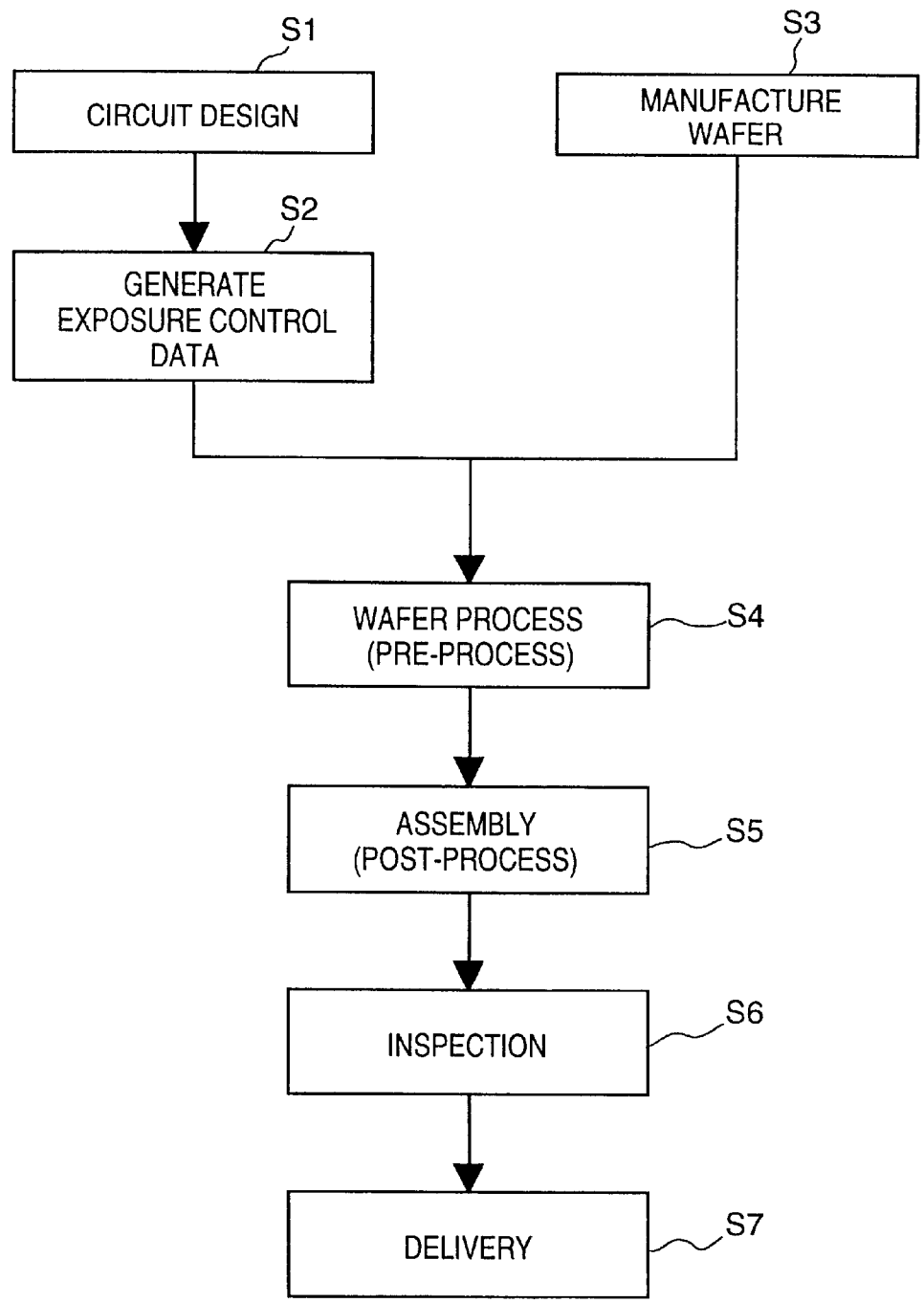
FIG. 18 is a flow chart for explaining the manufacturing flow of a microdevice.

FIG. 18 shows the overall flow in the manufacture of a microdevice (semiconductor chips such as ICs, LSIs, liquid crystal devices, thin film magnetic heads, micromachines, and the like). In step 1 (circuit design), the circuit design of a semiconductor device is made. In step 2 (generate exposure control data), the exposure control data of the exposure apparatus is generated based on the designed circuit pattern. On the other hand, in step 3 (manufacture wafer), a wafer is manufactured using materials such as silicon and the like. Step 4 (wafer process) is called a pre-process, and an actual circuit is formed by lithography on the wafer using the exposure apparatus input with the prepared exposure control data, and the manufactured wafer. The next step 5 (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation confirmation tests, durability tests, and the like of semiconductor devices assembled in step 5 are conducted. Semiconductor devices are completed via these processes, and are delivered (step 7).

Figure 19:
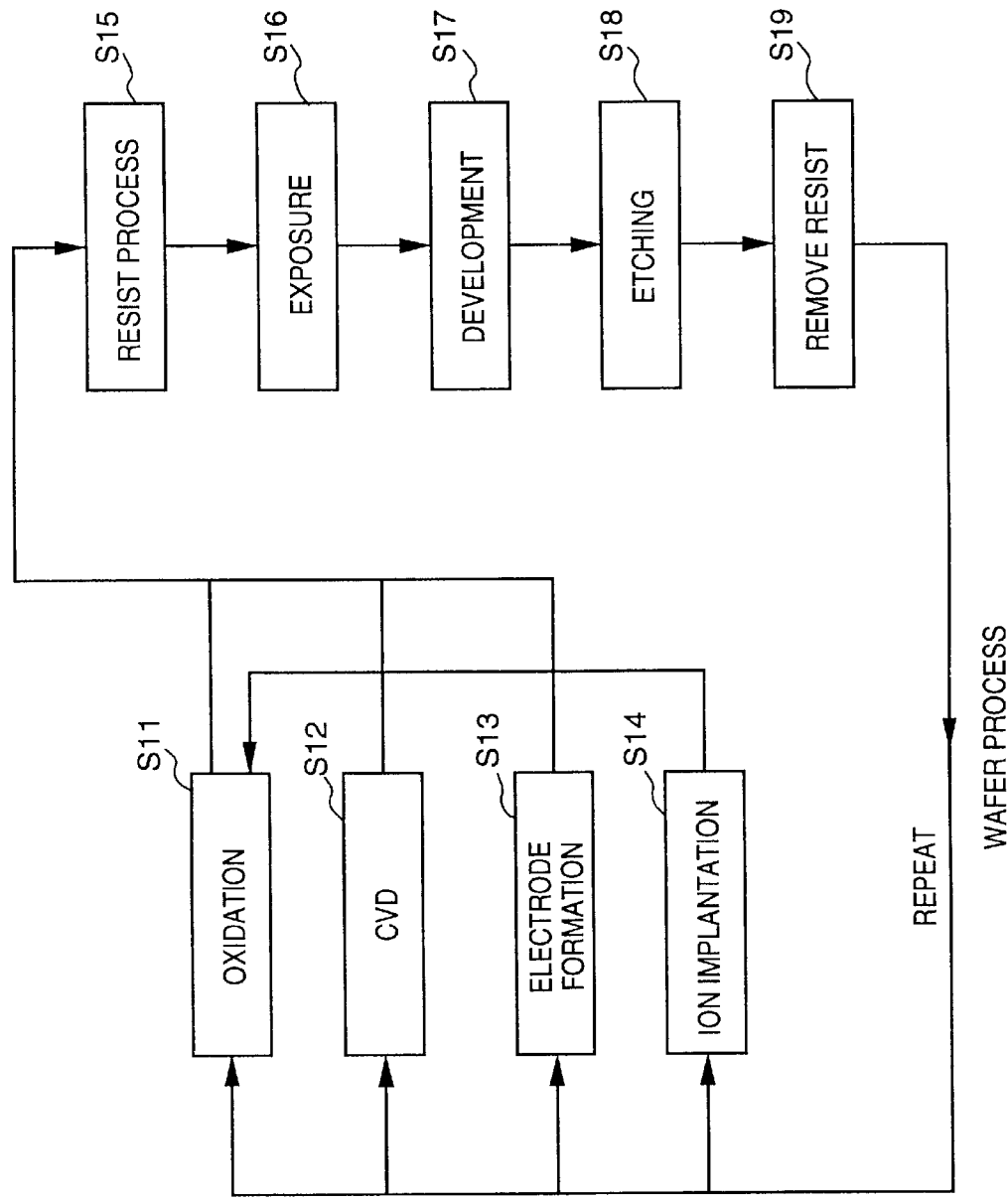
FIG. 19 is a flow chart for explaining the wafer process.
Figure 20:
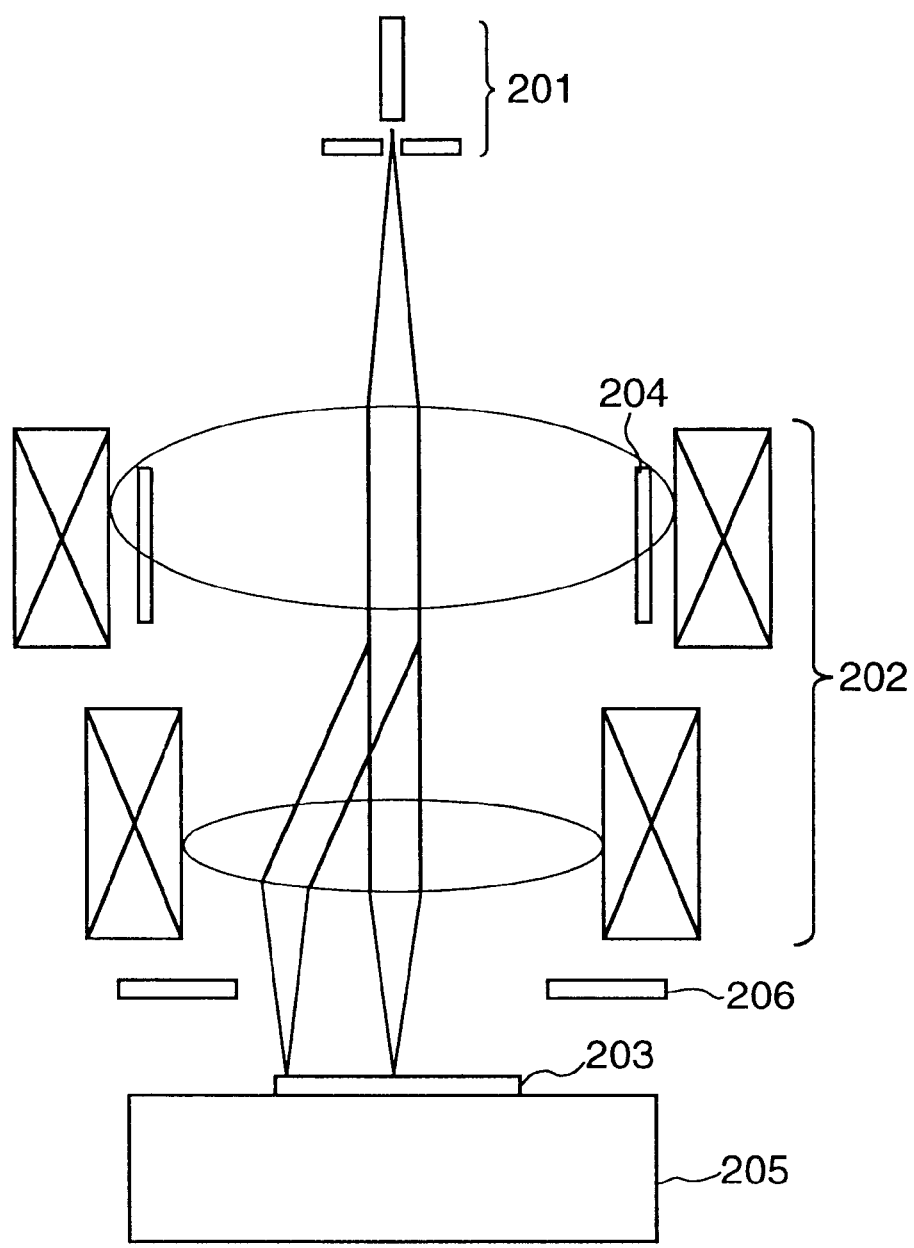
FIG. 20 shows the schematic arrangement of a conventional electron beam exposure apparatus.
Figure 21A:
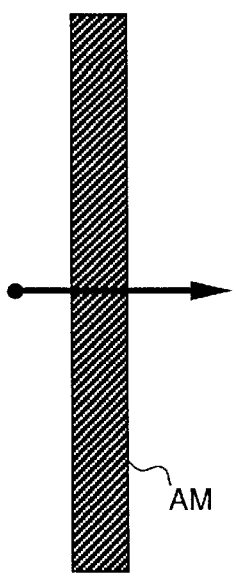
FIG. 21A is a plan view of an alignment mark AM formed on a wafer.
Figure 21B:
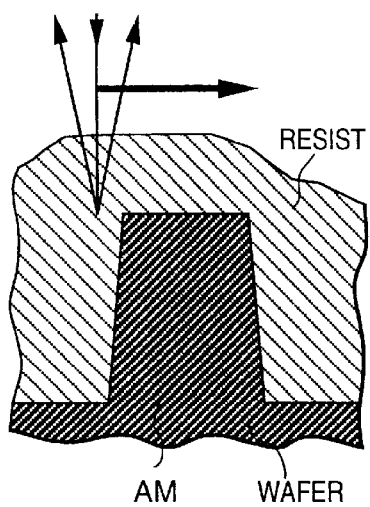
FIGS. 21B and 21C are sectional views of marks AM formed at different positions on the wafer.
Figure 21C:
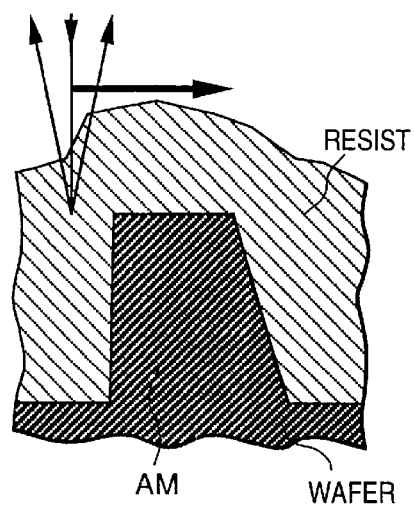
Figure 21D:
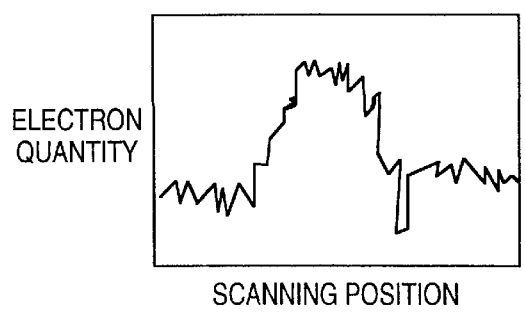
FIGS. 21D and 21E show alignment signals as the quantities of reflected electrons or secondary electrons detected upon scanning the alignment marks AM shown in FIGS. 21B and 21C.
Figure 21E:
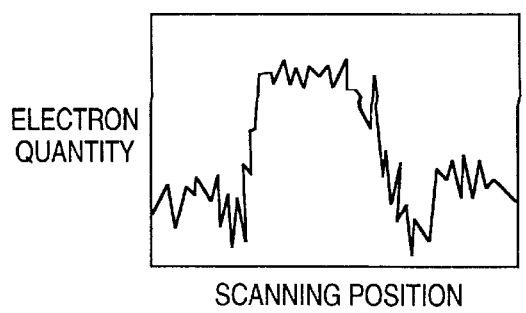

FIG. 19 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus. In step 17 (development), the exposed wafer is developed. In step 18 (etching), a portion other than the developed resist image is removed by etching. In step 19 (remove resist), the resist film which becomes unnecessary after etching is removed. By repetitively executing these steps, multiple circuit patterns are formed on the wafer.

According to the manufacturing method of this embodiment, a highly integrated semiconductor device which is not easy to manufacture by the conventional method can be manufactured with low cost.

The present invention is not limited to the above embodiments and various changes and modifications can be made within the spirit and scope of the present invention. Therefore, to apprise the public of the scope of the present invention, the following claims are made.

What is claimed is:

1. A position detection apparatus for detecting a central position of parallel linear patterns formed on an object using an electron beam, said apparatus comprising:

irradiation means for irradiating a plurality of electron beams at different positions on the object;

displacement means for displacing irradiated positions of the electron beams on the object by a substantially equal displacement amount in a predetermined direction;

electron detection means for synthesizing and detecting reflected electrons or secondary electrons from the linear patterns produced by the electron beams while displacing the irradiated positions of the plurality of electron beams on the linear patterns of the object by said displacement means; and determination means for detecting a phase of a periodic signal of a frequency determined by a pitch of the parallel linear patterns on the basis of a relationship between the displacement amount of the irradiated positions and a detection signal from said electron detection means, and for determining the central position of the parallel linear patterns on the basis of the detected phase.

2. The apparatus according to claim 1, wherein said irradiation means irradiates the plurality of electron beams with the irradiated positions of the plurality of electron beams on the object being arranged in a direction perpendicular to the predetermined direction.

3. The apparatus according to claim 1, wherein said irradiation means irradiates the plurality of electron beams with the irradiated positions of the plurality of electron beams on the object forming a matrix, and a pitch of the linear patterns is determined on the basis of an interval between the plurality of electron beams on the object in the predetermined direction.

4. The apparatus according to claim 3, wherein when Pm represents the pitch of the linear patterns, and Pb represents the interval between the plurality of electron beams on the object in the predetermined direction, the pitch Pm and the interval Pb satisfy:

Pb=N×Pm (N is an integer).

5. The apparatus according to claim 1, wherein said displacement means displaces the irradiated positions of the electron beams on the object by deflecting the plurality of electron beams irradiated from said irradiation means.

6. The apparatus according to claim 1, wherein said displacement means displaces the irradiated positions of the electron beams on the object by displacing the position of the object.

7. An electron beam exposure apparatus which comprises irradiation means for irradiating a plurality of electron beams onto an object to be arranged at a predetermined interval, and deflection means for displacing the electron beams by a substantially equal displacement amount on the object, and exposes the object to the plurality of electron beams, said apparatus comprising:

moving means, carrying the object, for causing parallel linear patterns formed on the object to fall within an irradiation region of the plurality of electron beams;

displacement control means for controlling at least one of said deflection means and said moving means so as to displace irradiated positions of the electron beams on the object by a substantially equal displacement amount in a predetermined direction;

electron detection means for synthesizing and detecting reflected electrons or secondary electrons from the linear patterns produced by the electron beams while changing the irradiated positions of the plurality of electron beams on the linear patterns by said displacement control means; and determination means for detecting a phase of a periodic signal of a frequency determined by a pitch of the linear patterns on the basis of a relationship between the displacement amount of the irradiated positions and a detection signal from said electron detection means, and for determining a central position of the linear patterns on the basis of the detected phase.

8. The apparatus according to claim 7, wherein said irradiation means irradiates the plurality of electron beams with the irradiated positions of the plurality of electron beams on the object being arranged in a direction perpendicular to the predetermined direction upon determining the central position of the linear patterns.

9. The apparatus according to claim 8, wherein said irradiation means irradiates the plurality of electron beams with the irradiated positions of the plurality of electron beams forming a matrix, and a pitch of the linear patterns is determined on the basis of an interval of the plurality of electron beams on the object in the predetermined direction.

10. The apparatus according to claim 9, wherein when Pm represents the pitch of the linear patterns, and Pb represents the interval between the plurality of electron beams on the object in the predetermined direction, the pitch Pm and the interval Pb satisfy:

Pb=N×Pm (N is an integer).

11. A position detection method for detecting a position of parallel linear patterns formed on an object using an electron beam, said apparatus comprising:

an electron detection step of irradiating a plurality of electron beams at different positions on the object, and synthesizing and detecting reflected electrons or secondary electrons from the linear patterns produced by the electron beams while displacing irradiated positions of the electron beams on the linear patterns by a substantially equal displacement amount in a predetermined direction; and a determination step of detecting a phase of a periodic signal of a frequency determined by a Ditch of the linear patterns on the basis of a relationship between the displacement amount of the irradiated positions and a detection signal obtained at the electron detection step, and determining a central position of the linear patterns on the basis of the detected phase.

12. The method according to claim 11, wherein the electron detection step includes the step of irradiating the plurality of electron beams with the irradiated positions of the plurality of electron beams on the object being arranged in a direction perpendicular to the predetermined direction.

13. The method according to claim 11, wherein the electron detection step includes the step of irradiating the plurality of electron beams with the irradiated positions of the plurality of electron beams on the object forming a matrix, and a pitch of the linear patterns is determined on the basis of an interval of the plurality of electron beams on the object in the predetermined direction.

14. The method according to claim 13, wherein when Pm represents the pitch of the linear patterns, and Pb represents the interval between the plurality of electron beams on the object in the predetermined direction, the pitch Pm and the interval Pb satisfy:

Pb=N×Pm (N is an integer).

15. The method according to claim 11, wherein the electron detection step includes the step of displacing the irradiated positions of the electron beams on the object by deflecting the plurality of electron beams emitted by an electron beam source.

16. The method according to claim 11, wherein the electron detection step includes the step of displacing the irradiated positions of the electron beams on the object by displacing a position of the object.

17. An electron beam exposure apparatus which comprises emission means for emitting an electron beam, a reduction electron optical system for projecting the electron beam emitted by said emission means onto a substrate in a reduced scale, deflection means for deflecting the electron beam to be irradiated onto the substrate, and a stage which carries the substrate, said apparatus comprising:

a reference plate arranged on said stage, said reference plate having parallel linear patterns;

setting means for setting an imaging state of the electron beam to be irradiated onto the substrate;

displacement control means for controlling at least one of said deflection means and said stage so as to displace an irradiated position of the electron beam on said reference plate on said stage in the arranging direction of the linear patterns;

electron detection means for detecting reflected electrons or secondary electrons from the linear patterns produced by the irradiated electron beam while changing the irradiated position of the electron beam on the linear patterns of said reference plate by said displacement control means; and adjustment means for detecting a strength of a periodic signal of a frequency determined by a pitch of the linear patterns on the basis of a relationship between a displacement amount of the irradiated position and a detection signal from said electron detection means, for confirming the imaging state of the electron beam on the basis of the strength, and for adjusting said setting means on the basis of the confirmed imaging state.

18. The apparatus according to claim 17, wherein said adjustment means sequentially changes a setting value to be set in said setting means, confirms the imaging state of the electron beam on the reference plate at each of the setting values so as to obtain data indicating a relationship between the setting values and imaging states, and adjusts said setting means on the basis of the data.

19. The apparatus according to claim 17, wherein said emission means emits a plurality of electron beams which are arranged in a direction perpendicular to the arranging direction of the linear patterns on said reference plate, and said electron detection means synthesizes and detects the reflected electrons or secondary electrons from the linear patterns produced by the irradiated electron beams.

20. The apparatus according to claim 17, wherein said emission means emits a plurality of electron beams which form a matrix on said reference plate, and said electron detection means synthesizes and detects the reflected electrons or secondary electrons from the linear patterns produced by the irradiated electron beams.

21. The apparatus according to claim 17, wherein said reference plate has first linear patterns which are arranged in a first direction, and second linear patterns which are arranged in a second direction, perpendicular to the first direction, and said adjustment means confirms an imaging state of the electron beam on the first linear patterns and an imaging state of the electron beam on the second linear patterns, and adjusts said setting means on the basis of the confirmation result.

22. The apparatus according to claim 17, wherein said adjustment means adjusts said setting means to optimize the imaging state of the electron beam upon drawing a pattern on the substrate on the basis of the confirmation result of the imaging state of the electron beam on the linear patterns.

23. The apparatus according to claim 22, wherein said setting means comprises focal point position correction means for correcting a focal point position of the electron beam to be irradiated onto the substrate, and said adjustment means adjusts said focal point position correction means to correct the focal point position of the electron beam upon drawing a pattern on the substrate on the basis of the confirmation result of the imaging state of the electron beam on the linear patterns.

24. The apparatus according to claim 22, wherein said setting means comprises astigmatism correction means for correcting astigmatism of the electron beam to be irradiated onto the substrate, and said adjustment means adjusts said astigmatism correction means to correct the astigmatism of the electron beam upon drawing a pattern on the substrate on the basis of the confirmation result of the imaging state of the electron beam on the linear patterns.

25. The apparatus according to claim 22, wherein said setting means comprises focal point position correction means for correcting a focal point position of the electron beam to be irradiated onto the substrate, and astigmatism correction means for correcting astigmatism of the electron beam to be irradiated onto the substrate, and said adjustment means adjusts said focal point position correction means and said astigmatism correction means to correct the focal point position and astigmatism of the electron beam upon drawing a pattern on the substrate on the basis of the confirmation result of the imaging state of the electron beam on the linear patterns.

26. A method of correcting an imaging state of an electron beam in an electron beam exposure apparatus which comprises emission means for emitting an electron beam, a reduction electron optical system for projecting the electron beam emitted by said emission means onto a substrate in a reduced scale, deflection means for deflecting the electron beam to be irradiated onto the substrate, a stage which carries the substrate and on which a reference plate having linear patterns is arranged, and setting means for setting an imaging state of the electron beam to be irradiated onto the substrate, said method comprising:

an electron detection step of detecting reflected electrons or secondary electrons from the linear patterns produced by the irradiated electron beam while displacing the irradiated position of the electron beam on the linear patterns of the reference plate in the arranging direction of the linear patterns; and an adjustment step of detecting a strength of a periodic signal of a frequency determined by a pitch of the linear patterns on the basis of a relationship between a displacement amount of the irradiated position and a detection signal in the electron detection step, confirming the imaging state of the electron beam on the basis of the strength, and adjusting said setting means on the basis of the confirmed imaging state.

27. The method according to claim 26, wherein the adjustment step includes the step of sequentially changing a setting value to be set in said setting means, confirming the imaging state of the electron beam on the reference plate at each of the setting values so as to obtain data indicating a relationship between the setting values and imaging states, and adjusting said setting means on the basis of the data.

28. The method according to claim 26, wherein said emission means emits a plurality of electron beams which are arranged in a direction perpendicular to the arranging direction of the parallel linear patterns on said reference plate, and the electron detection step includes the step of synthesizing and detecting the reflected electrons or secondary electrons from the linear patterns produced by the irradiated electron beams.

29. The method according to claim 26, wherein said emission means emits a plurality of electron beams which form a matrix on said reference plate, and the electron detection step includes the step of synthesizing and detecting the reflected electrons or secondary electrons from the linear patterns produced by the irradiated electron beams.

30. The method according to claim 26, wherein said reference plate has first linear patterns which are arranged in a first direction, and second linear patterns which are arranged in a second direction, perpendicular to the first direction, and the adjustment step includes the step of confirming an imaging state of the electron beam on the first linear patterns and an imaging state of the electron beam on the second linear patterns, and adjusting said setting means on the basis of the confirmation result.

31. The method according to claim 26, wherein the adjustment step includes the step of adjusting said setting means to optimize the imaging state of the electron beam upon drawing a pattern on the substrate on the basis of the confirmation result of the imaging state of the electron beam on the linear patterns.

32. The method according to claim 31, wherein said setting means comprises focal point position correction means for correcting a focal point position of the electron beam to be irradiated onto the substrate, and the adjustment step includes the step of adjusting said focal point position correction means to correct the focal point position of the electron beam upon drawing a pattern on the substrate on the basis of the confirmation result of the imaging state of the electron beam on the linear patterns.

33. The method according to claim 31, wherein said setting means comprises astigmatism correction means for correcting astigmatism of the electron beam to be irradiated onto the substrate, and the adjustment step includes the step of adjusting said astigmatism correction means to correct the astigmatism of the electron beam upon drawing a pattern on the substrate on the basis of the confirmation result of the imaging state of the electron beam on the linear patterns.

34. The method according to claim 31, wherein said setting means comprises focal point position correction means for correcting a focal point position of the electron beam to be irradiated onto the substrate, and astigmatism correction means for correcting astigmatism of the electron beam to be irradiated onto the substrate, and the adjustment step includes the step of adjusting said focal point position correction means and said astigmatism correction means to correct the focal point position and astigmatism of the electron beam upon drawing a pattern on the substrate on the basis of the confirmation result of the imaging state of the electron beam on the linear patterns.

35. A method of manufacturing a device using an electron beam exposure apparatus, said method comprising:

an electron detection step of irradiating a plurality of electron beams at different positions on the object, and synthesizing and detecting reflected electrons or secondary electrons, produced by the electron beams, from linear patterns formed on the object, while displacing irradiated positions of the electron beams on the linear patterns by a substantially equal displacement amount in a predetermined direction; and a determination step of detecting a phase of a periodic signal of a frequency determined by a pitch of the linear patterns on the basis of a relationship between the displacement amount of the irradiated positions and a detection signal obtained from the electron detection step, and determining a central position of the linear patterns on the basis of the detected phase.

36. A method of manufacturing a device using an electron beam exposure apparatus, which comprises emission means for emitting an electron beam, a reduction electron optical system for projecting the electron beam emitted by the emission means onto a substrate in a reduced scale, deflection means for deflecting the electron beam to be irradiated onto the substrate, a stage which carries the substrate and on which a reference plate having linear patterns is arranged, and setting means for setting an imaging state of the electron beam to be irradiated onto the substrate, said method comprising:

an electron detection step of detecting reflected electrons or secondary electrons, produced by the irradiated electron beam, from the linear patterns, while displacing the irradiated position of the electron beam on the linear patterns of the reference plate in the arranging direction of the linear patterns; and an adjustment step of detecting a strength of a periodic signal of a frequency determined by a pitch of the linear patterns on the basis of a relationship between a displacement amount of the irradiated positions and a detection signal obtained from the electron detection step, confirming the imaging state of the electron beam on the basis of the strength, and adjusting the setting means on the basis of the confirmed imaging state.

* * * * *

UNITED STATES PATENT AND TRADEMARK OFFICE
CERTIFICATE OF CORRECTION

PATENT NO. : 5,929,454

DATED : July 27, 1999

INVENTOR(S): MASATO MURAKI, ET AL.

Figure 22A:
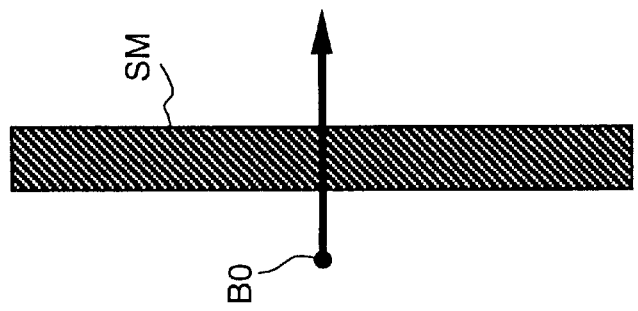
FIG. 22A is a plan view of a linear reference mark
Figure 22B:
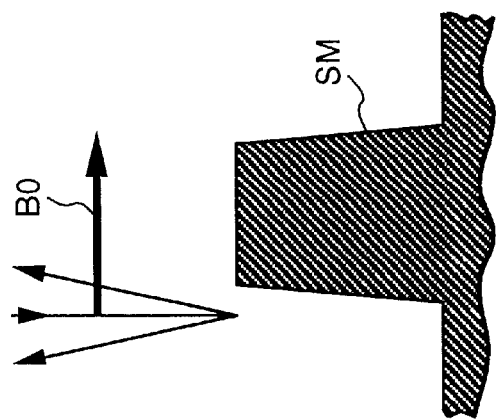
FIG. 22B is a sectional view of the reference mark SM.
Figure 22C:
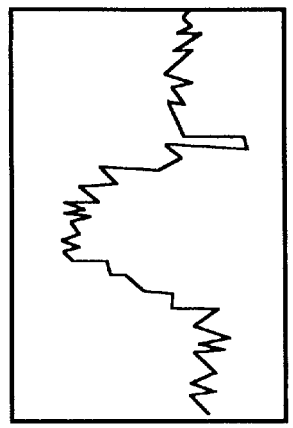
FIG. 22C shows a mark signal which represents the quantity of reflected electrons or secondary electrons detected upon scanning the reference mark SM.

It is certified that error appears in the above-identified patent and that said Letters Patent is hereby corrected as shown below:

COLUMN 6,
Line 44, "FIG." should read --SM;-- and
Line 45, "22B" should read --¶ FIG. 22B--.

COLUMN 8,
Line 16, "D(1.1)" should read --D(1,1)--.

Signed and Sealed this

Fourteenth Day of March, 2000

Attest:

Q. TODD DICKINSON

Attesting Officer

Commissioner of Patents and Trademarks